(12) United States Patent
Kishikawa et al.

(10) Patent No.: US 7,095,497 B2
(45) Date of Patent: Aug. 22, 2006

(54) BEAM SPLITTING APPARATUS, TRANSMITTANCE MEASUREMENT APPARATUS, AND EXPOSURE APPARATUS

(75) Inventors: Yasuhiro Kishikawa, Tochogi (JP); Seiji Takeuchi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 11 days.

(21) Appl. No.: 10/183,311

(22) Filed: Jun. 25, 2002

(65) Prior Publication Data
US 2003/0043376 A1 Mar. 6, 2003

(30) Foreign Application Priority Data
Jun. 27, 2001 (JP) ............................. 2001-195580
Jun. 28, 2001 (JP) ............................. 2001-196015

(51) Int. Cl.
*G01J 4/00* (2006.01)
(52) U.S. Cl. ..................................................... 356/364
(58) Field of Classification Search .............. 359/483, 359/485, 487, 495, 583
See application file for complete search history.

(56) References Cited

U.S. PATENT DOCUMENTS

| 3,463,575 | A | * | 8/1969 | Gates, Jr. .................... 359/487 |
| 4,252,410 | A | * | 2/1981 | Jain ........................... 359/487 |
| 5,398,112 | A | * | 3/1995 | Ai et al. ..................... 356/514 |
| 5,475,491 | A | | 12/1995 | Shiozawa |
| 5,719,702 | A | * | 2/1998 | Decker ....................... 359/495 |
| 5,784,202 | A | | 7/1998 | Noguchi |
| 6,008,497 | A | | 12/1999 | Mizoguchi et al. |
| 6,124,064 | A | | 9/2000 | Ozawa |
| 6,252,650 | B1 | | 6/2001 | Nakamura |

FOREIGN PATENT DOCUMENTS

| JP | 4-102178 | 4/1992 |
| JP | 7-320090 | 12/1995 |
| JP | 8-221595 | 8/1996 |
| JP | 11-096394 | 4/1999 |
| JP | 11-328427 | 11/1999 |

OTHER PUBLICATIONS

Ho et al., Neutral and color-selective beam splitting assemblies with polarization-independent intensities, Jul. 1, 1992, Applied Optics, vol. 31, No. 19, pp. 3813-3820.*

* cited by examiner

*Primary Examiner*—Richard A. Rosenberger
*Assistant Examiner*—Juan D. Valentin, II
(74) *Attorney, Agent, or Firm*—Morgan & Finnegan, L.L.P.

(57) ABSTRACT

A beam splitting apparatus generates, from incident light having a specific polarization, first and second split light that has the specific polarization.

3 Claims, 19 Drawing Sheets

BEAM SPLITTING APPARATUS, TRANSMITTANCE MEASUREMENT APPARATUS, AND EXPOSURE APPARATUS

BACKGROUND OF THE INVENTION

The present invention relates to beam splitting systems for splitting incident light, and measuring systems using the beam splitting systems. The inventive beam splitting system is suitable for a light intensity control unit for monitoring a light intensity of an ultraviolet (UV) pulse laser, such as an excimer laser as a light source.

The present invention also relates to measuring systems utilizing optical mechanisms, and more particularly to an apparatus for measuring the transmittance of a sample using the UV light. The present invention is suitable, for example, for an apparatus for measuring the transmittance of an optical element using a UV pulse laser as a light source.

Along with the recent demand on smaller and lower profile electronic devices, minute semiconductor devices to be mounted onto these electronic devices have been increasingly demanded. In order to meet this demand, various proposals have been made to improve exposure resolution. The quality of an image to be transferred onto a wafer, etc. is significantly affected by the illumination performance, e.g., distributions of illumination on the mask and wafer planes. Therefore, in order to provide high quality semiconductor wafers, LCDs, and thin-film magnetic heads, accurate exposure amount control is necessary.

An exposure amount control apparatus typically splits light from a light source using a half mirror, etc., receives it via a light receiving element, and feedback-controls a light intensity of the light source so that a light intensity fluctuation at the illuminated area may fall within a permissible range. The half mirror is provided, for example, after an optical integrator, in a position equivalent to a pattern on a reticle or mask (these terms are interchangeably used in this application).

Use of a shorter wavelength has been promoted to improve resolution. The light source changes from a KrF excimer laser (with a wavelength of about 248 nm) to an ArF excimer laser (with a wavelength of about 193 nm). An $F_2$ excimer laser (with a wavelength of about 157 nm) is about to be put to practical use. An optical element in an optical system in the exposure apparatus requires the high transmission property for UV light supplied from the light source and high resistance to the UV light so that it seldom attenuates transmittance for long-time exposure. The optical element must be fully examined for its transmission property and UV resistance, and thus its transmittance has been measured frequently.

A transmittance measurement apparatus typically splits a UV laser beam of an object excimer laser using a half mirror by reflecting and transmitting it, receives a reflected beam (a reference beam) by one sensor, receives the transmitted beam (or tested beam) by another sensor after the transmitted beam transmits through a sample, and measures the sample's transmittance by calculating a ratio between light intensities detected with and without the sample.

On the other hand, an exposure amount control apparatus typically splits light from the light source using a half mirror, receives it via a sensor, and feeds back the light intensity of the light source so that fluctuations in the light intensity in the illumination area may fall within a permissible range. A half mirror is provided, for example, after an optical integrator, in a position equivalent to a pattern on a reticle.

A conventional exposure amount control apparatus and transmittance measurement apparatus disadvantageously cannot accurately detect the light intensity, resulting in insufficient exposure amount control and transmittance measurement. As well, they cannot provide high quality devices with good exposure performance such as a throughput.

As a result of eager studies over causes of this problem, the instant inventors have discovered that the conventional erroneous light intensity detection results in polarized fluctuation of laser beam. A half mirror has different reflectance and transmittance for p and s polarization components of the laser beam. The polarizations of two beams split by the half mirror fluctuate when the laser beam (i.e., light incident on the half mirror) has polarized fluctuation. The polarized fluctuation occurs when a polarization component of the laser beam incident upon a half mirror fluctuates in accordance with the oscillation voltage or changes for each pulse. In case, the sensor cannot accurately detect the light intensity of the laser beam because a ratio of light intensities between incident and split light fluctuates due to a fluctuated polarizations between the beam incident on the half mirror and the split light that has passing through the half mirror.

BRIEF SUMMARY OF THE INVENTION

Accordingly, it is an exemplified object of the present invention to provide a beam splitting apparatus that enables accurate detection and control over a light intensity of a light source.

Another exemplary object of the present invention is to provide a transmittance measurement apparatus and an exposure apparatus, which can accurately detect the transmittance of a sample.

A beam splitting apparatus according to one aspect of the present invention generates, from incident light having a specific polarization, first and second split light, each of which has the specific polarization. This beam splitting apparatus can generate the first and second split light while making the polarizations of the first and second split light the same as that of the incident light.

A beam splitting apparatus of another aspect of the present invention includes a first splitting part for generating, from incident light having a specific polarization, first split light that has the specific polarization, and a second splitting part for generating, from the incident light, second split light that has the specific polarization. This beam splitting apparatus can generate first split light at the first splitting part while making the polarization of the first split light the same as that of the incident light. This beam splitting apparatus can generate second split light at the second splitting part while making the polarization of the second split light the same as that of the incident light.

A beam splitting apparatus of still another aspect of the present invention includes a first splitting part for generating first split light so that incident light having a specific polarization is reflected as a p polarization component for the first time and then reflected as an s polarization component for the second time, and a second splitting part for generating second split light so that the incident light having a specific polarization has transmitted as the p polarization component for the first time and then transmitted as the s polarization component for the second time. This beam splitting apparatus can make the first split light have the same polarization as that of the incident light by reflecting the p polarization component, when the incident light is reflected for the first time at the first splitting part, for the second time as the s polarization component. This beam splitting apparatus can make the second split light have the same polarization as that of the incident light by transmitting the p polarization component, when the incident light has transmitted for the first time at the second splitting part, for the second time as the s polarization component.

A beam splitting apparatus of another aspect of the present invention includes a first optical member for reflecting and transmitting incident light having a specific polarization to generate reflected light and transmitted light, a second optical member that uses the reflected beam to generate first split light having the specific polarization, and a third optical member that uses the transmitted light to generate second split light having the specific polarization. This splitting apparatus installs the third optical member to make the light having transmitted through the first optical member have the same polarization as that of the incident light. Specifically, the second optical member reflects the reflected light as a linear polarized component orthogonal to that reflected by the first optical member. The third optical member transmits the transmitted light as a polarized component orthogonal to that having transmitted through the first optical member. Such second and third optical members, which reflect and transmit the specific linear polarized component of the incident light as a linear polarized component that is orthogonal to the linear polarized component, perform an operation to make the split light have the same polarization as that of the incident light. For example, the first to third members may have the same reflectance and transmission properties. The first to third members may be plane parallel plates, and the plane parallel plates are arranged such that their incident angle is 45°.

A light intensity detecting apparatus of another aspect of the present invention includes one of the above beam splitting apparatuses, and a detector for detecting a light intensity of either one of the first and second light split by the beam splitting apparatus. This light intensity detecting apparatus includes the above beam splitting apparatus, and exhibits a similar operation. This light intensity detecting apparatus can use the detector to detect split light that has the same polarization as that of the incident light, thus detecting the amount of the split light accurately even when the polarization of the incident light fluctuates.

A light intensity control unit includes the above light intensity detecting apparatus, and a control part for controlling a light intensity of the incident light based on a detection result of the detector in the light intensity detecting apparatus. This light intensity control unit includes the above light intensity detecting apparatus, and exhibits a similar operation. This light intensity control unit controls the light intensity of the incident light based on detection result of the light intensity detecting apparatus, thus controlling the incident light accurately.

A light intensity detecting apparatus of another aspect of the present invention includes two of the above beam splitting apparatuses, arranged such that a sample is interposed in between, a first detector that detects a light intensity of either one of the first and second light split by one of the two beam splitting apparatuses, and a second detector that detects a light intensity of either one of the first and second light split by the other one of the two beam splitting apparatuses.

A transmittance measurement apparatus of another aspect of the present invention includes the above light intensity detecting apparatus and a processing unit for calculating transmittance of the sample based on a ratio between detection results by the first and second detectors in the light intensity detecting apparatus with and without the sample.

This transmittance measurement apparatus includes the above light intensity detecting apparatus, and exhibits a similar operation. It is possible to accurately measure the transmittance by calculating a ratio between detection results at the processing unit with and without the sample.

A light intensity detecting apparatus of another aspect of the present invention includes a plurality of the above beam splitting apparatuses, and a detector for detecting a light intensity of one of multiple beams split by the plurality of beam splitting apparatuses. This light intensity detecting apparatus includes a plurality of the above beam splitting apparatuses, and exhibits a similar operation. This light intensity detecting apparatus can use a detector to detect multiple split beams that have the same polarization as that of the incident beam, and to accurately detect light intensities of multiple split beams even when the polarization of the incident light fluctuates.

A transmittance measurement apparatus of another aspect of the present invention includes a first beam splitting part for generating first split beam having a specific polarization from light emitted from a light source, a second beam splitting part for generating, from the first split beam, a second split beam having the polarization, a first detector for detecting a light intensity of the first split beam, and a second detector for detecting a light intensity of the second split beam, wherein a transmittance of a sample is measured based on a difference between detection results by the first and second detectors with and without the sample in the first or second split beam. This transmittance measurement apparatus can equalize polarizations of the first and second split beams. The transmittance measurement apparatus may further comprise a stage for carrying the sample and removably inserting the sample onto an optical axis of the first or second split beam. This stage can periodically remove the sample from the second split beam (tested beam). Therefore, this transmittance measurement apparatus cancel an offset when a laser beam is not irradiated to the sample by monitoring changes in output ratio. The light source is an ultraviolet pulse laser and thus even when a laser beam has polarized fluctuation in the transmittance measurement apparatus, the polarizations of the first and second split beams are maintained to be equal. The inventive transmittance measurement apparatus can measure the transmittance of the sample with accuracy.

A transmittance measurement apparatus of another aspect of the present invention includes a first optical member for reflecting and transmitting light from a light source to generate reflected and transmitted beams, a second optical member for transmitting the reflected beam to generate a first split beam having a specific polarization, a third optical member for reflecting the transmitted beam to generate a second split beam having the specific polarization, a first detector that detects a light intensity of the first split beam, and a second detector that detects a light intensity of the second split beam, wherein a transmittance of a sample is measured based on a difference between detection results by the first and second detectors with and without the sample in the second split beam. In this transmittance measurement apparatus, the first and second optical members correspond to the first beam splitting part, and the first and third optical members correspond to the second beam splitting part, thus exhibiting an operation similar to the above transmittance measurement apparatus.

The first and second split beams may have an equal number of reflection times on the first and third optical members and equal polarization characteristics at the reflections, as well as an equal number of transmission times on the first and second optical members and equal polarization characteristics at the transmissions.

A transmittance measurement apparatus of another aspect of the present invention includes a first optical member for reflecting and transmitting light emitted from a light source to generate reflected and transmitted beams, and uses the reflected beam as a first split beam having a specific polarization, a second optical member for transmitting and reflecting the transmitted beam to generate transmitted and reflected beams, a third optical member for reflecting the transmitted beam generated by the second optical member to generate a second split beam having the specific polarization, a first detector for detecting a light intensity of the first split beam, and a second detector for detecting a light intensity of the second split beam, wherein a transmittance of a sample is measured based on a difference between detection results by the first and second detectors with and without the sample in the second split beam. In this transmittance measurement apparatus, the first optical member corresponds to the first beam splitting part, and the first to third optical members correspond to the second beam splitting part, thus exhibiting an operation similar to the above transmittance measurement apparatus.

The first and second split beams may have an equal number of reflection times on the first and third optical members and equal polarization characteristics at the reflections, while the second optical member transmits the transmitted beam as a linear polarization component orthogonal to that having transmitted the first optical member.

A transmittance measurement apparatus of another aspect of the present invention includes a first optical member for reflecting and transmitting light emitted from a light source to generate reflected and transmitted beams, and uses the reflected beam as a first split beam having a specific polarization, a second optical member for transmitting and reflecting the transmitted beam to generate transmitted and reflected beams, a third optical member for reflecting the reflected beam generated by the second optical member to generate a second split beam having the specific polarization, a first detector for detecting a light intensity of the first split beam, and a second detector for detecting a light intensity of the second split beam, wherein a transmittance of a sample is measured based on a difference between detection results by the first and second detectors with and without the sample in the second split beam. In this transmittance measurement apparatus, the first optical member corresponds to the first beam splitting part, and the first to third optical members correspond to the second beam splitting part, thus exhibiting an operation similar to the above transmittance measurement apparatus.

The first and second split beams may have an equal number of reflection times on the first and second optical members and equal polarization characteristics at the reflections, while the third optical member transmits the transmitted beam as a linear polarization component orthogonal to that having transmitted the first optical member.

A transmittance measurement apparatus of another aspect of the present invention includes a first optical member for reflecting and transmitting light emitted from a light source to generate reflected and transmitted beams, and uses the transmitted beam as a first split beam having a specific polarization, a second optical member for transmitting and reflecting the transmitted beam to generate transmitted and reflected beams, a third optical member for reflecting the transmitted beam generated by the second optical member to generate a second split beam having the specific polarization, a first detector for detecting a light intensity of the first split beam, and a second detector for detecting a light intensity of the second split beam, wherein a transmittance of a sample is measured based on a difference between detection results by the first and second detectors with and without the sample in the second split beam. In this transmittance measurement apparatus, the first optical member corresponds to the first beam splitting part, and the first to third optical members correspond to the second beam splitting part, thus exhibiting an operation similar to the above transmittance measurement apparatus.

The first and second split beams may have an equal number of transmission times on the first and second optical members and equal polarization characteristics at the transmissions, while the third optical member reflects the reflected beam as a linear polarization component that is orthogonal to that having reflected on the first optical member.

A transmittance measurement apparatus of another aspect of the present invention includes a first optical member for reflecting and transmitting light emitted from a light source to generate reflected and transmitted beams, and uses the transmitted beam as a first split beam having a specific polarization, a second optical member for transmitting and reflecting the reflected beam to generate transmitted and reflected beams, a third optical member for transmitting the reflected beam generated by the second optical member to generate a second split beam having the specific polarization, a first detector for detecting a light intensity of the first split beam, and a second detector for detecting a light intensity of the second split beam, wherein a transmittance of a sample is measured based on a difference between detection results by the first and second detectors with and without the sample in the second split beam. In this transmittance measurement apparatus, the first optical member corresponds to the first beam splitting part, and the first to third optical members correspond to the second beam splitting part, thus exhibiting an operation similar to the above transmittance measurement apparatus.

The first and second split beams may have an equal number of transmission times on the first and second optical members and equal polarization characteristics at the transmissions, while the third optical member reflects the reflected beam as a linear polarization component that is orthogonal to that having reflected on the first optical member. The first, second, and third members may be optical elements having the same reflectance and transmittance properties. The first, second, and third members may be plane parallel plates. The plane parallel plates may be arranged such that an incident angle is 45°.

An optical element fabricated from the sample having transmittance of a specific value or higher, measured by the above transmittance measurement apparatus. Such an optical element may be a lens, a diffraction grating, an optical film, and a combination thereof. The transmittance of such an optical element has been measured accurately and the optical element has reliable optical performance.

An exposure apparatus of another aspect of the present invention that uses ultraviolet light, deep ultraviolet light and vacuum ultraviolet light as exposure light, irradiates the light onto an object to be exposed via an optical system including the above optical element. Such an exposure apparatus includes a member having reliable optical performance in UV, far UV, and vacuum UV light, thus realizing an accurate (high-resolution) exposure.

An exposure apparatus of another aspect of the present invention includes an illumination optical system which uses light emitted from a light source to illuminate a mask, on which a desired pattern is created, one of the above beam splitting apparatuses, provided in a position approximately conjugate with the mask, a detector for detecting a light intensity of either one of the first and second light split by the beam splitting apparatus, and a control part for controlling a light intensity of the light source based on a detection result by the detector. Such an exposure apparatus includes the above beam splitting apparatus, and exhibits a similar operation. This detector can accurately detect an exposure amount without influence by a fluctuating polarization characteristic of the illumination optical system. Thus, such an exposure apparatus can control the exposure amount accurately, thus realizing an exposure with accuracy. A device fabricating method and a device as a product using such an exposure apparatus also function as an aspect of the present invention.

Other objects and further features of the present invention will become readily apparent from the following description of the embodiments with reference to accompanying drawings.

DETAILED DESCRIPTION OF THE PREFERRED EMBODIMENTS

Figure 1:
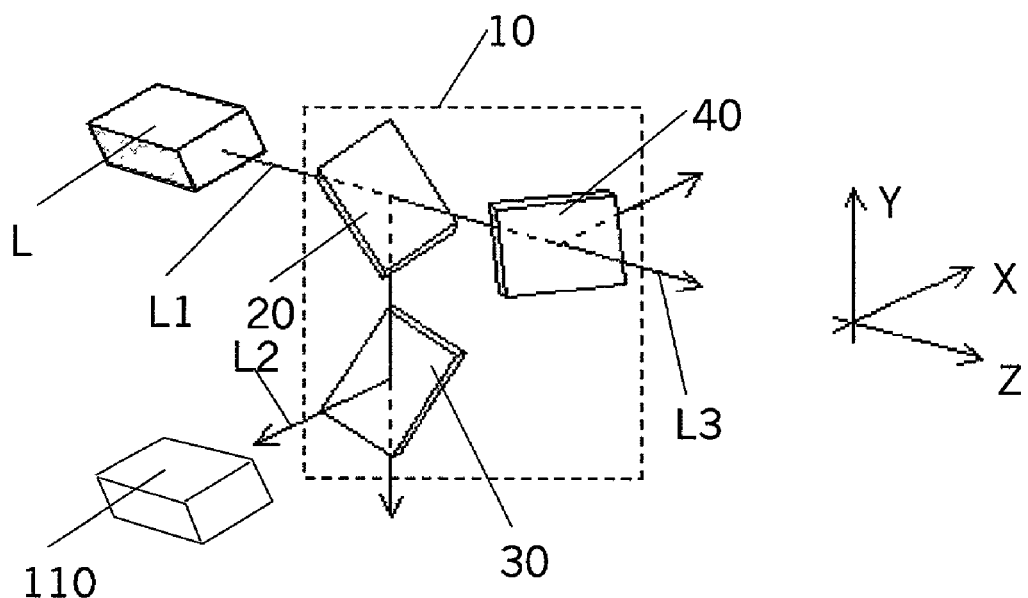
FIG. 1 is a schematic perspective view showing a light intensity detecting apparatus that includes a splitting means as one aspect of the present invention.
Figure 6:
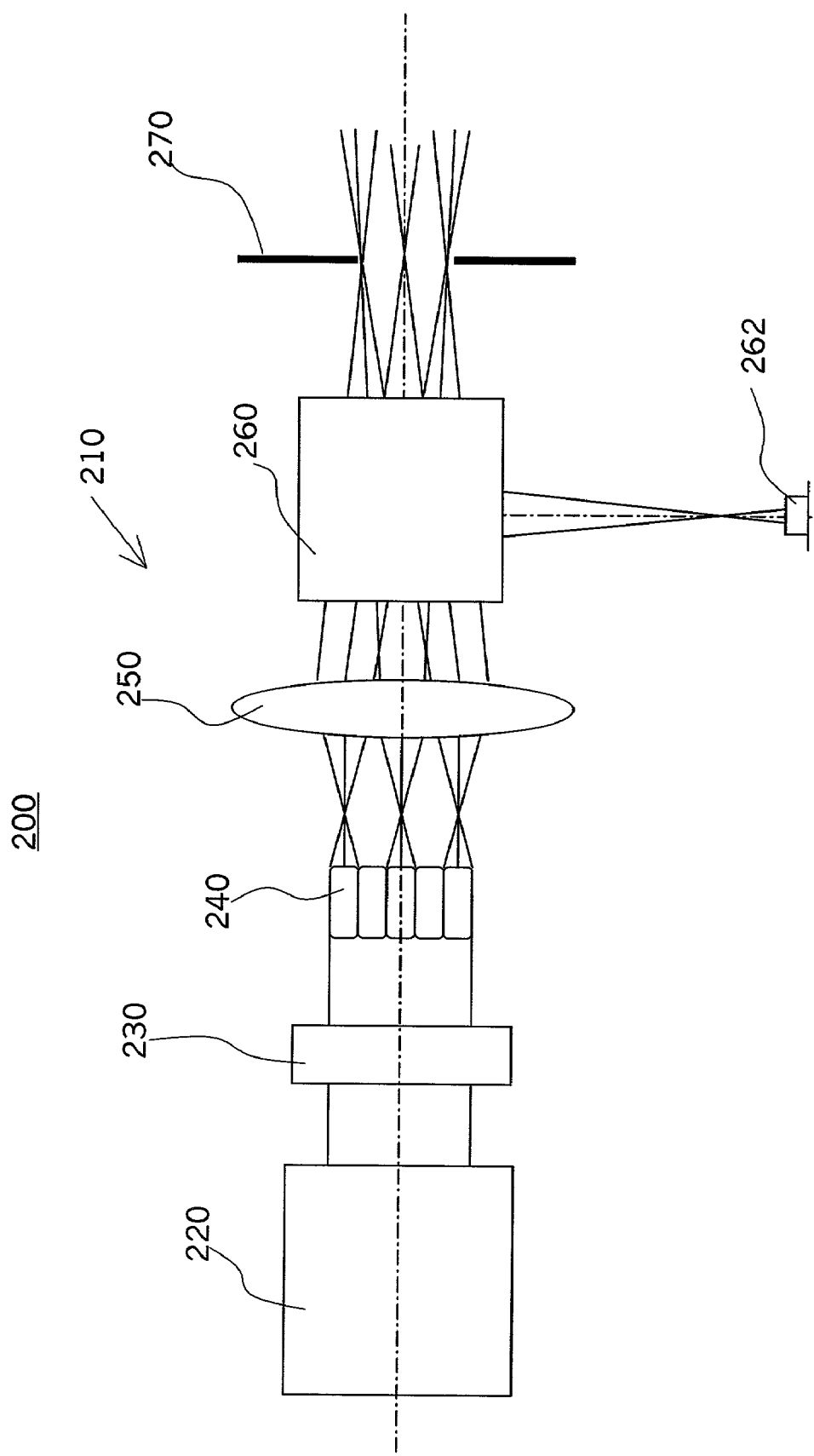
FIG. 6 is a schematic side view showing part of an exposure apparatus that includes a beam splitting part as one aspect of the present invention.

Referring to accompanying drawings, a description will now be given of a light intensity detecting apparatus 100 including a beam splitting part 10 as one aspect of the present invention and an exposure apparatus 200 including the beam splitting part 10. In each figure, the same reference numeral indicates the same element. The same reference numeral having an alphabetic capital letter is a variation of that having no alphabetic letter, and a reference numeral with no alphabetic letter generalizes reference numerals with alphabetic letters unless otherwise specified. FIG. 1 is a schematic perspective view showing a light intensity detecting apparatus 100 that includes the beam splitting part 10. FIG. 6 is a schematic side view showing part of the exposure apparatus 200 that includes the beam splitting part 10.

A description will now be given of the light intensity detecting apparatus 100 that includes the beam splitting part 10. As shown in FIG. 1, the light intensity detecting apparatus 100 is a measurement system for detecting a light intensity from a light source L, and includes the beam splitting part 10 and a detector 110. The light detecting apparatus 100 provides the beam splitting part 10 on the optical axis of light L1 emitted from the light source L, and the detector 110 in place to detect at least one of beams L2 and L3 split by the beam splitting part 10. FIG. 1 assumes that a traveling direction of the light L1 is a Z-axis, a direction vertical to the Z-axis in a plane of the light source L is an X-axis, and a normal direction to the plane of the light source L is a Y-axis. Although the detector 110 is provided on the side of the light L2 in FIG. 1, this structure is for exemplary purposes only and thus it may detect the beam L3. As described later, when the light intensity detecting apparatus 100 serves to measure the transmittance, the light source L may be one element in the light intensity detecting apparatus 100.

The beam splitting part 10 generates two split beams L2 and L3 from the light L1 from the light source L so that these beams have the same polarization of that of the light L1. The beam splitting part 10 includes three plane parallel plates (i.e., first, second and third plane parallel plates 20–40). The first plane parallel plate 20 is arranged on the optical axis of the light L1 from the light source L. The second plane parallel plate 30 is arranged, with a specific limitation, on the optical axis of light reflected by the first plane parallel plate 20. The third plane parallel plate 40 is arranged on the optical axis of light that has transmitted through the first plane parallel plate 20, with the specific limitation as described later. The plane parallel plates 20–40 can be an optical element such as a beam splitter and the like, but is not limited to this as long as they exhibit an operation required by the present invention. In order to maintain high efficiency to the split beams and to deliver the beams to detectors with minimized loss, beam splitters themselves are also required to have high durability and high transmittance at the wavelength of the light source. When using high energy light sources, such as KrF, ArF and $F_2$ excimer lasers with short wavelengths, the thickness of the beam splitters, whether they are cubes or parallel plates, must be minimized. Especially with pulsed lasers, the instantaneous energy can be very high and may give damages to the materials of beam splitters. For use with UV, DUV, VUV and high energy pulsed light sources, plane parallel plates are often preferred as the beam splitters. Similarly, the plane parallel plates 20–40 preferably, but are not limited to, have the same reflection and transmission properties as long as they meet the relationship below.

Figures 2A, 2B, 2C:
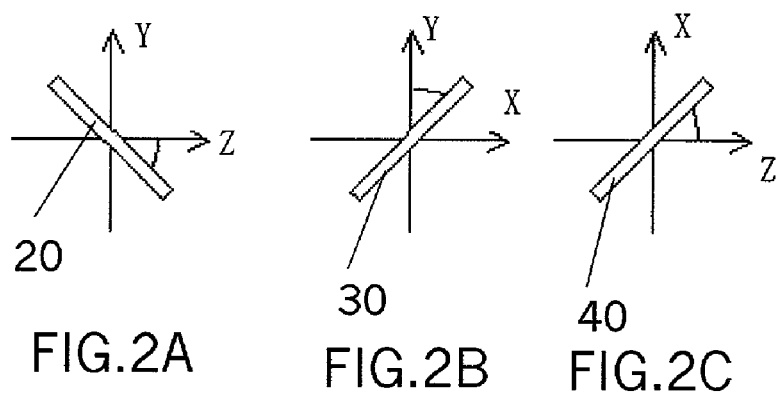
FIG. 2A is a side view showing a first plane parallel plate shown in FIG. 1 on a plane ZY.
FIG. 2B is a side view showing a second plane parallel plate shown in FIG. 1 on a plane XY.
FIG. 2C is a side view showing a third plane parallel plate shown in FIG. 1 on a plane ZX.

The first plane parallel plate 20 reflects and transmits the light L1, thereby splitting it into two beams. As shown in FIGS. 1 and 2A, the first plane parallel plate 20 is arranged such that the incident plane of the light L1 is in parallel to the X-axis, and its normal direction of the incident plane forms 45° with the optical axis of the light L1. Here, FIG. 2A is a side view showing the first plane parallel plate 20 on the plane ZY. FIG. 2B is a side view showing the second plane parallel plate 30 on a plane XY. FIG. 2C is a side view showing the third plane parallel plate 40 on a plane ZX. It is noted that the first plane parallel plate 20 does not necessarily have the above set angle as long as it may split the light L1 into two.

From the light reflected by the first plane parallel plate 20, the second plane parallel plate 30 generates the light L2 that has the same polarization as that of the light L1. As shown in FIG. 1, the light L1 from the light source L may be split basically using the first plane parallel plate 20 to reflect and transmit the light L1. Nevertheless, the beam splitting part 10 arranges the second plane parallel plate 30 relative to the first plane parallel plate 20, to generate the beam L2 having the same polarization as that of the light L1.

As shown in FIGS. 1 and 2B, when the first plane parallel plate 20 is arranged to form 45° with the Z-axis, the second plane parallel plate 30 is arranged such that the incident plane of the light reflected on the first plane parallel plate 20 is in parallel to the Z-axis, and its normal direction of the incident plane forms 45° with the optical axis of this reflected light. Of course, the present invention is not limited only to such a value. Rather, the second plane parallel plate 30 may be arranged such that the beam L2 has the same polarization as that of the light L1. Part of the light, reflected by the first plane parallel plate 20, transmits the second plane parallel plate 30 and then is absorbed by a damper (not shown). This may prevent transmitting component of the beam L2 from becoming flare.

From the light that has transmitted through the first plane parallel plate 20, the third plane parallel plate 40 generates the light L3 that has the same polarization as that of the light L1. As discussed, the light L1 from the light source L may be split basically using the plane parallel plate 20 to reflect and transmit the light L1. Nevertheless, the inventive beam splitting part 10 arranges the third plane parallel plate 40 relative to the plane parallel plate 20, to generate the beam L3 that has the same polarization as that of the light L1.

As shown in FIGS. 1 and 2C, when the first plane parallel plate 20 is arranged to form 45° with the Z-axis, the third plane parallel plate 40 is arranged such that the incident plane of the light having transmitted through the first plane parallel plate 20 is in parallel to the Y-axis, and the normal direction of the incident plane forms 45° with the optical axis of this transmitted light. Of course, the present invention is not limited to such a value, and the third plane parallel plate 40 may be arranged such that the beam L3 has the same polarization as that of the light L1. In this structure, the third plane parallel plate 40 further transmits the light that has transmitted through the plane parallel plate 20, generating the beam L3 having the same polarization as that of the light L1. The third plane parallel plate 40 reflects the light, but a damper (not shown) absorbs this reflected light. This may prevent a reflected component of the light L3 from becoming flare.

The detector 110 detects the light intensity of the incident light. The detector 110 is arranged on the optical axis of the beams L2 and/or L3. The detector includes a light receiving element and processor, measuring the light intensity of the light. Any known technique is applicable to the detector, and a detailed description thereof will be omitted. Light detected by the detector 110 will be discussed in detail in the description of the operation given later.

A description will now be given of the operation of the inventive light intensity detecting apparatus 100. The light L1 is initially emitted from the light source L. It is, for example, a UV pulse laser such as an excimer laser. The first plane parallel plate 20 reflects and transmits the light L1 from the light source L, splitting it into two beams. Where $I_H$ and $I_V$ are intensities of horizontal and vertical components of the light L1 in FIG. 1, the polarization of the light L1 may be expressed by the following equation 1.

$$\frac{|I_H - I_V|}{I_H + I_V} \quad (1)$$

The reflected light and transmitted light are further reflected and transmitted by the second and third plane parallel plates 30 and 40. The light reflected by the second plane parallel plate 30 becomes the light L2, and a damper shields the transmitted light. The light that has transmitted through the third plane parallel plate 40 becomes the beam L3, and a damper shields the reflected light. As discussed, the second and third plane parallel plates 30 and 40 are arranged such that the light L2 and L3 have the same polarization as that of light L1.

The intensities of the horizontal and vertical components of the light L2 can be expressed by equations 2 and 3:

$$r_s^2 r_p^2 I_V \quad (2)$$

-continued $$r_p^2 r_s^2 I_H \quad (3)$$

where r is a Fresnel reflection coefficient, and subscripts p and s are polarization components at the time of reflection. Using these equations 2 and 3, the polarization of the light L2 may be expressed by the equation 4:

$$\frac{|r_s^2 r_p^2 I_V - r_p^2 r_s^2 I_H|}{r_s^2 r_p^2 I_V + r_p^2 r_s^2 I_H} = \frac{|I_H - I_V|}{I_H + I_V} \quad (4)$$

Notably, the equation 4 shows that the light L2 reflected by the first and second plane parallel plates 20 and 30 has the same polarization as that of the light L1.

The intensities of the horizontal and vertical components of the light L3 may be expressed by equations 5 and 6:

$$t_{pr}^2 r_p^2 t_{sr}^2 r_s^2 I_H \quad (5)$$

$$t_{sr}^2 r_s^2 t_{pr}^2 r_p^2 I_V \quad (6)$$

where t is a Fresnel transmission coefficient, subscripts p and s are polarization components at the time of transmission, and a subscript r is a side of an exit plane of the plane parallel plate. From these equations 5 and 6, the polarization of the light L3 may be expressed by the equation 7:

$$\frac{t_{pr}^2 r_p^2 t_{sr}^2 r_s^2 I_H - t_{sr}^2 r_s^2 t_{pr}^2 r_p^2 I_V}{t_{pr}^2 r_p^2 t_{sr}^2 r_s^2 I_H + t_{sr}^2 r_s^2 t_{pr}^2 r_p^2 I_V} = \frac{|I_H - I_V|}{I_H + I_V} \quad (7)$$

Understandably, the equation 7 shows that the light L3, which is reflected by the first and third plane parallel plates 20 and 40, has the same polarization as that of the light L1.

The inventive light intensity detecting apparatus 100 uses the beam splitting part 10 having three plane parallel plates 20–40, and provides split beams (i.e., L2 and L3) with the same polarization as that of the light L1. As discussed, this structure requires the second and third plane parallel plates 30 and 40 to be arranged such that the beams L2 and L3 have the same polarization as that of the light L1. This means that the second and third plane parallel plates 30 and 40 need to be arranged such that the polarizations of the beams L2 and L3 reflected and transmitted by these plates meets the equation 1.

A description will now be given of the way of detection of the light intensity of the light source L by the detector 110 arranged on the optical path of the light L2 and/or L3. In the light intensity detecting apparatus 100 of the present embodiment, each of the split beams L2 and L3 has the same polarization as that of the incident light L1. Even when the light L1 fluctuates, the light intensity detecting apparatus 100 can detect the light intensities of the beams L2 and L3 accurately because a ratio between light intensities of the light L2 and L3 relative to the light L1 does not change.

While the detector 110 is arranged on the optical axis of the beam L2, a sample may be arranged on the optical path of the beam L3 and the detector may be arranged on the optical path of the beam that has transmitted through the sample. The light intensity measuring apparatus 100 serves as a transmittance measurement apparatus using this structure to measure a ratio between light intensities with and without the sample. This structure uses as a tested beam the beam L3 having transmitted twice through the plane parallel plates 20 and 40. Thereby, the light intensity of the light source L may be detected with accuracy, when a high power light intensity is supplied onto the sample, without influence by polarized fluctuation of the light source L. This structure uses as a detection beam the beam L2 that was reflected twice on the plane parallel plate, and thus it serves as a light-attenuating means such as an ND filter to adjust the intensity of a UV pulse laser beam for desired energy density. This may reduce measurement errors caused by the components of the ND filter and others, and monitor the light intensity of the light L1 with accuracy.

In the above structure of the transmittance measurement, when the sample is arranged on the optical path of the light L2 (between the second plane parallel plate 30 and the detector 110), it is possible to monitor the light intensity of a laser beam when the low power light intensity is supplied to the sample, since the light L2 having transmitted a plane parallel plate twice is used as a tested beam.

In the above light intensity detecting apparatus 100, a control part may be provided for controlling the light intensity of the light source L based on a detection result by the detector 110. As a result, the light intensity detecting apparatus also serves as a light intensity control unit.

Figure 3:
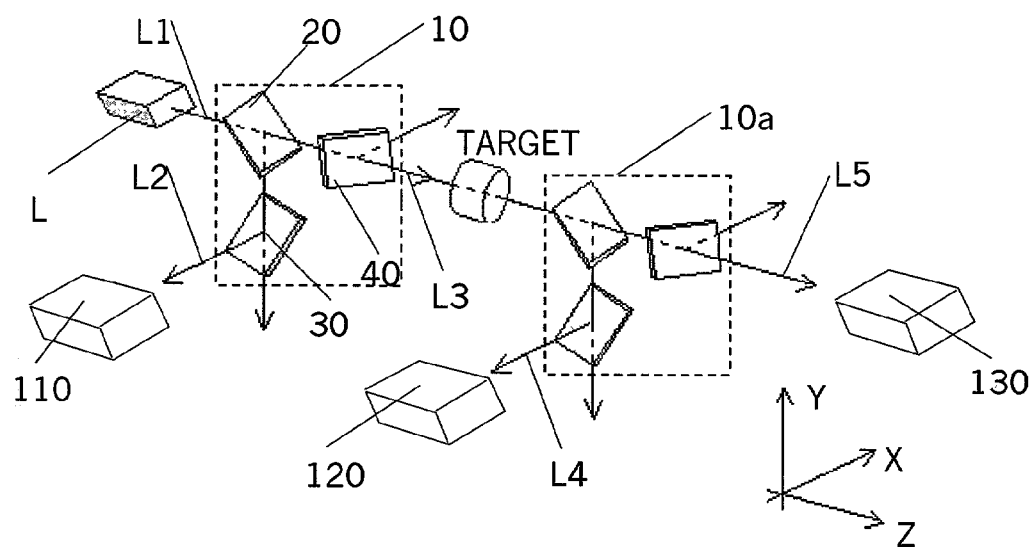
FIG. 3 is a schematic perspective view showing a variation of the light intensity detecting apparatus shown in FIG. 1.

Referring to FIG. 3, a description will now be given of a light intensity detecting apparatus 100A as a variation of the light intensity detecting apparatus 100. Here, FIG. 3 is a schematic perspective view showing the light intensity detecting apparatus 100A as a variation of the light intensity detecting apparatus 100. The light intensity detecting apparatus 100A combines two splitting means 10 shown in FIG. 1 so as to serve as a light intensity detecting apparatus for measuring the transmittance of a UV pulse laser beam, etc. As shown in FIG. 3, the light intensity detecting apparatus 100A further includes a splitting means 10 (shown as a splitting means 10a in FIG. 3) for splitting the beam L3 of the light intensity detecting apparatus 100 shown in FIG. 1. Since the light intensity detecting apparatus 100A uses the similar components to those of the light intensity detecting apparatus 100, a detailed description thereof will be omitted.

As in the above light intensity detecting apparatus 100, the light L1 from the light source L is split into two beams L2 and L3 by the splitting means 10. The detector 110 for detecting the light intensity of the light L2 is provided on the optical path of the beam L2, and the sample is arranged on the optical path of the light L3. The light L3 having transmitted the sample is split into two beams L4 and L5 by the splitting means 10a on the optical path of the light L3. The detectors 120 and 130 are arranged on the optical paths of the beams L4 and L5, respectively.

In this structure, from signal beams of the reference beam (L2) and the tested beam (L4) detected by the detectors 110 and 120, intensity ratio is calculated as (tested beam voltage average/reference beam voltage average). From the intensity ratio I measured with the sample in the tested beam and the intensity ratio I0 measured without the sample, the sample's transmittance for the UV pulse laser beam is calculated as T=I/I0. The detector 130 connected to the beam L5 is used to detect the power of the laser beam from the light source L.

This light intensity detecting apparatus 101A uses the beam L2 as a tested beam, which has transmitted the plane parallel plate twice. The light intensity of the laser beam may be detected when a high power light intensity is irradiated to the sample. For the above reasons, all of the beams (L2, L4, and L5) detected by three detectors (not shown) have the same polarization as that of the light L1 from the light source L. Thus, it is possible to detect the light intensity of the laser beam accurately without influence by polarized fluctuation of the laser beam from the light source L. A transmittance of an optical member, etc., may be measured for the UV pulse laser beam.

The light intensity detecting apparatus 100A uses as a signal beam the beam having transmitted a plane parallel plate twice. Thus, such a plane parallel plate also serves as a light-attenuating means such as an ND filter to adjust the intensity of a UV pulse laser beam for desired energy density. This may accurately reduce measurement errors caused by the components of the ND filter and the like. The amount of the laser beam may be monitored with accuracy. The transmittance of the optical member, etc., may be also measured accurately for the UV pulse laser beam.

Figure 7:
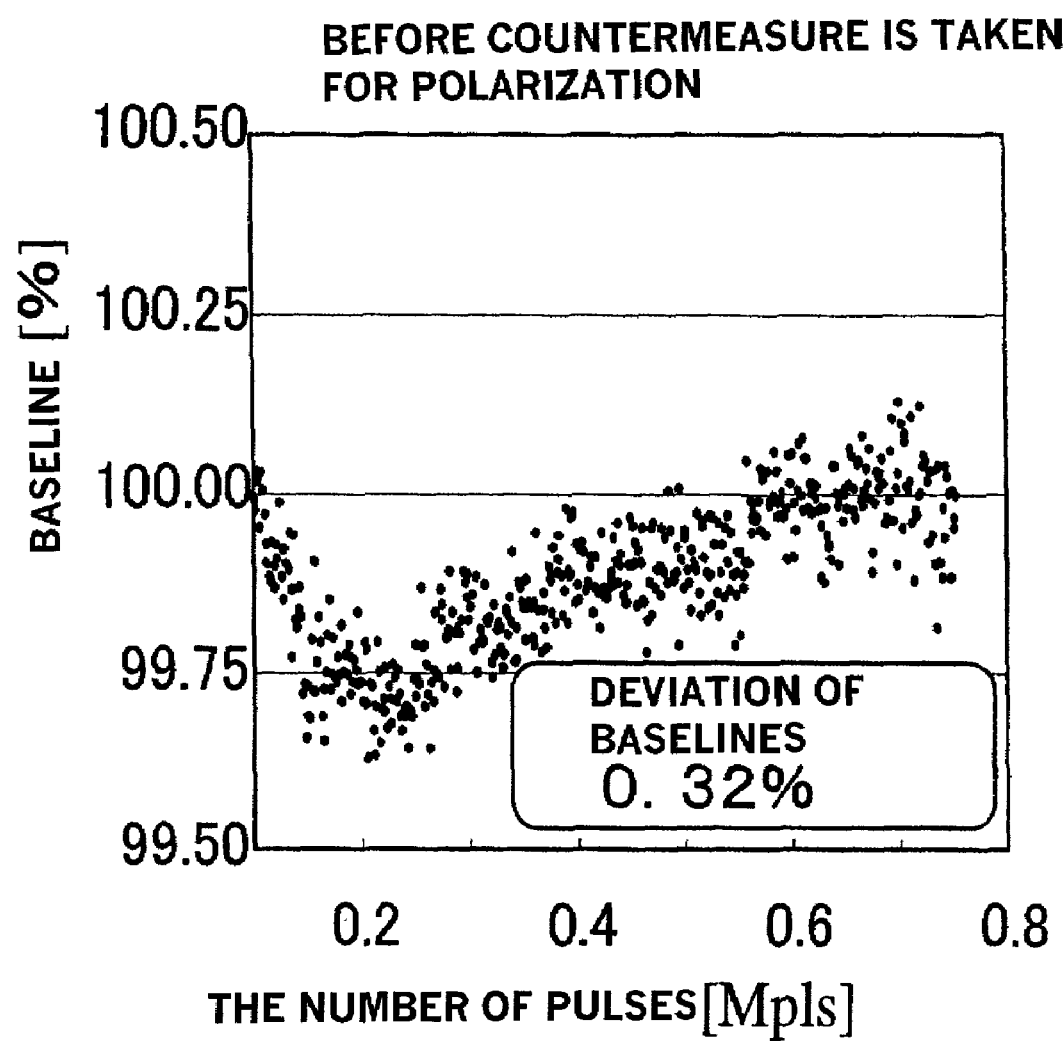
FIG. 7 is a view showing a measurement result of a transmittance baseline before a polarization is considered.
Figure 8:
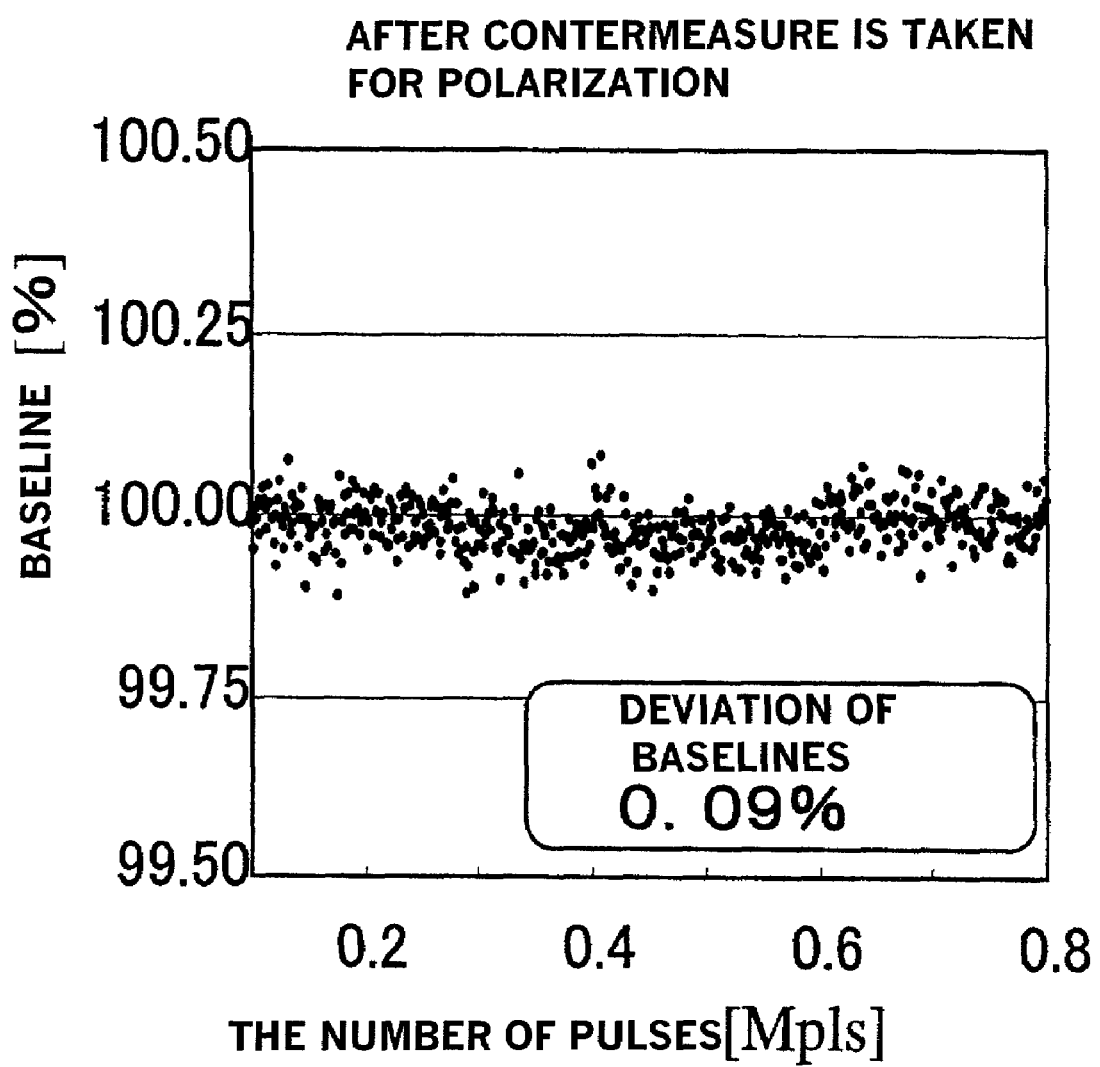
FIG. 8 is a view showing a measurement result of a transmittance baseline using the light intensity detecting apparatus shown in FIG. 3.

Referring to FIGS. 7 and 8, it is understood in view of the conventional structure, the light intensity detecting apparatus 100A maintains high detection accuracy. Here, FIG. 7 is a view showing a measurement result of a transmittance baseline before a countermeasure is taken for the polarization. FIG. 8 is a view showing a measurement result of the transmittance baseline using the light intensity detecting apparatus shown in FIG. 3. The horizontal axis in the figure is the number of laser pulses [Mpls], and the vertical axis is a transmittance baseline [%].

FIG. 7 shows that the deviation of the baseline is 0.32% when no countermeasure is taken for the polarization. In the light intensity detecting apparatus 10A, on the other hand, the deviation of the baseline is 0.09%. Since the measurement accuracy is below 0.1% when the polarization is preserved using the beam splitting part 10, the measurement accuracy is three times as high as that in FIG. 7. This result assures the usefulness of the inventive beam splitting part 10.

Figure 4:
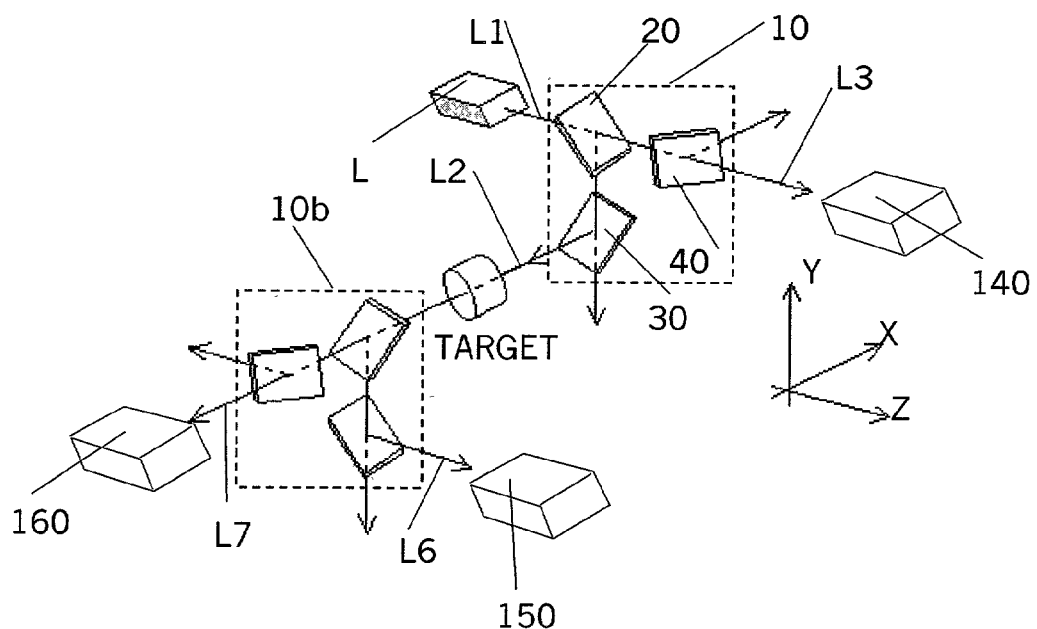
FIG. 4 is a schematic perspective view showing another variation of the light intensity detecting apparatus shown in FIG. 1.

Referring FIG. 4, a description will be given of a light intensity detecting apparatus 100B as another variation of the light intensity detection apparatus 100. Here, FIG. 4 is a schematic perspective view showing a light intensity detecting apparatus 100B as another variation of the light intensity detection apparatus 100. The light intensity detecting apparatus 100B combines two splitting means 10 shown in FIG. 1 so as to serve as a light intensity detecting apparatus for measuring the transmittance of a UV pulse laser beam, etc. As shown in FIG. 4, the light intensity detecting apparatus 100B further includes a splitting means 10 (shown as a splitting means 10b in FIG. 4) for splitting the light L2 of the light intensity detecting apparatus 100. Since the light intensity detecting apparatus 100B uses the similar components to those of the light intensity detecting apparatus 100, a detailed description thereof will be omitted.

As in the above light intensity detecting apparatus 100, the light L1 from the light source L is split into two beams L2 and L3 by the beam splitting part 10. The light intensity detecting apparatus 100B arranges a detector 140 on the optical path of the beam L3, and a sample on the optical path of the beam L2. The beam having transmitted the sample is split by the splitting means 10b arranged on the optical path of the beam L3 into two beams L6 and L7. Detectors 150 and 160 are arranged on the optical paths of the beams L6 and L7, respectively.

In this structure, the light intensity detecting apparatus 100B calculates an intensity ratio as (tested beam voltage average/reference beam voltage average) from signal beam of the reference and tested beams detected by the detectors 140 and 150. Thus, the intensity ratio I measured with the sample in the tested beam (beam L2) and the intensity ratio I0 measured without the sample, the sample's transmittance for the UV pulse laser beam is calculated as T=I/I0. The detector 160 connected to the beam L7 is used to detect the power of the laser beam.

This light intensity detecting apparatus 100B uses as a tested beam the beam L2, which has transmitted the plane parallel plate twice. The light intensity of the laser beam may be detected when a low power light intensity is supplied to the sample. The light detected by the detectors connected to the beams L3, L6, and L7 have the same polarization as that of the light L1 from the light source L. As a result, the light intensity of the laser beam may be monitored accurately without influence by polarized fluctuation of the laser beam L1 from the light source L. The transmittance of the optical member, etc., may also be measured accurately for the UV pulse laser beam.

As discussed, by combining two splitting means 10, the light intensity detecting apparatuses 100A and 10B can monitor the light intensity of the laser beam when high and low power light intensities are supplied to the sample. The light intensity of the laser beam may be monitored with accuracy without influence by polarized fluctuation of the laser beam. The transmittance of the optical member, etc., may also be monitored accurately for the UV pulse laser beam.

Figure 5:
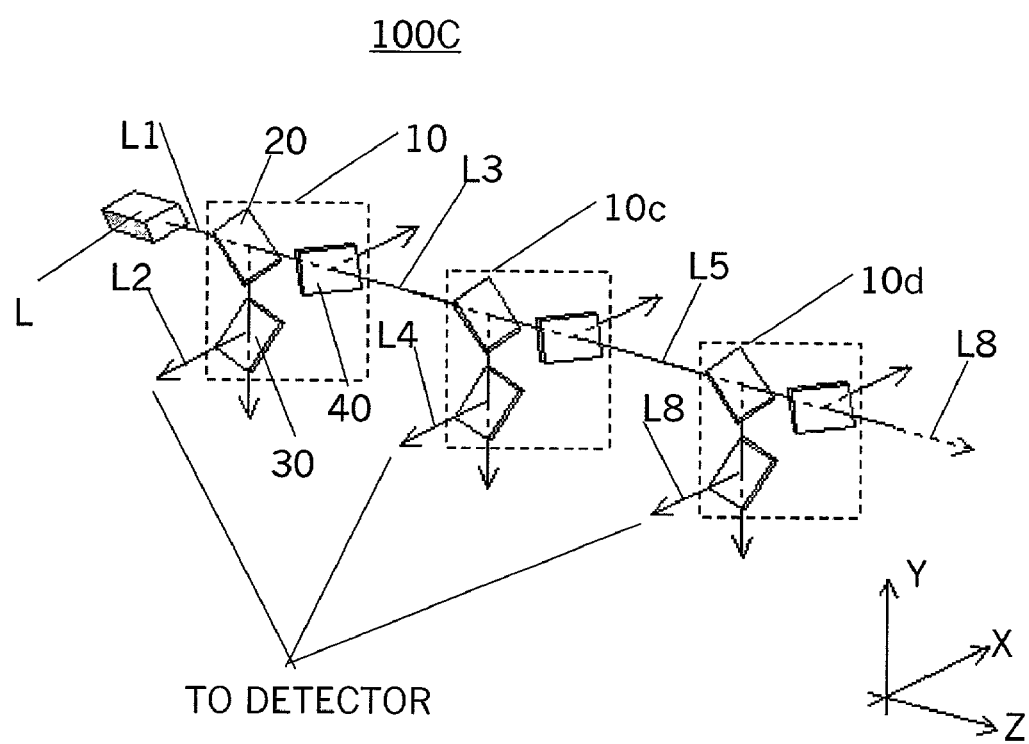
FIG. 5 is a schematic perspective view showing still another variation of the light intensity detecting apparatus shown in FIG. 1.

Referring to FIG. 5, a description will be given of a light intensity detecting apparatus 100C as still another variation of the light intensity detecting apparatus 100. Here, FIG. 5 is a schematic perspective view showing the light intensity detecting apparatus 100C as still another variation of the light intensity detecting apparatus 100. The light intensity detecting apparatus 100C combines three or more splitting means 10 shown in FIG. 1 so as to serve as a light intensity detecting apparatus for evaluating linearity and the like of a photo-sensor, etc. As shown in FIG. 5, the light intensity detecting apparatus 100C includes splitting means 10 in series (shown exemplarily as two splitting means 10c and 10d in FIG. 5) for splitting the light L3 of the light intensity detecting apparatus 100 shown in FIG. 1. Since the light intensity detecting apparatus 100C uses the similar components to those of the light intensity detecting apparatus 100, a detailed description thereof will be omitted.

In this structure, the light L1 from the light source L can generate as many beams as the number of splitting means 10 like the beams L2, L4, L8, . . . , by connecting the splitting means 10 shown in FIG. 1 in parallel. Detectors (not shown) are arranged, for example, on the optical path of the beams L2, L4, L8, . . . , and light intensities of beams detected by these detectors are monitored. In this light intensity detecting apparatus 100C, like the above light intensity detecting apparatus 100, each laser beam detected by the detector has the same polarization as that of the light L1 from the light source L. The light intensity of a laser beam may be monitored with accuracy without influence by polarized fluctuation of the laser beam of the light source L. It is also possible to accurately evaluate linearity and the like of a photo-sensor, etc., for the UV pulse laser beam.

The light intensity detecting apparatus 100C detects as a signal beam the beam reflected twice on a plane parallel plate. This plane parallel plate serves as a light-attenuating means such as an ND filter, etc. to adjust the intensity of the UV pulse laser beam for desired energy density. This may reduce causes of measurement errors due to components, and monitor the light intensity of a laser beam with accuracy. It is also possible to accurately measure linearity and the like of a photo-sensor, etc., for the UV pulse laser beam.

Referring to FIG. 6, a description will be given of an exposure apparatus 200 that includes the beam splitting part 10 as one aspect of the present invention. As shown in FIG. 6, the exposure apparatus 200 includes an illumination apparatus including an illumination optical system, a mask (not shown), a projection optical system (not shown), and a control part (not shown). The exposure apparatus 200 is a projection exposure apparatus that exposes a pattern created on the mask onto a wafer W in a step-and-scan manner. The "step-and-scan" manner, as used herein, is one mode of exposure method which exposes a mask pattern onto a wafer by continuously scanning the wafer relative to the mask, and by moving, after a shot of exposure, the wafer stepwise to the next exposure area to be shot.

The illumination apparatus 210 typically includes laser 220 as a light source and an illumination optical system, thus illuminating the mask (not shown) on which a pattern to be transferred is created.

The laser 220 is a light source that emits illumination light, e.g., an $F_2$ excimer laser with a wavelength of about 157 nm. However, the laser 220 may be replaced with an ArF excimer laser with a wavelength of about 193 nm, etc.

The illumination optical system is an optical system that irradiates a beam to the mask (not shown), and includes an optical system 230, an optical integrator (or a light integrator) 240, a condensing lens 250, a beam splitting part 260, a blade (stop) 270, and an imaging lens (not shown). An optical element fabricated from the sample having a transmittance of a preset value or higher, and measured by the transmittance measurement apparatus of the present invention, is applicable to optical elements such as lenses for the illumination optical system.

The optical system 230 includes a plurality of lenses, and forms, for example, an afocal system that is telecentric at incidence and exit sides. The afocal system (optical system 230) in this system enables to continuously magnify and demagnify light (at the beam cross-section of a coherent beam) from the laser 220 into two directions orthogonal at the optical axis.

The optical integrator, which is, for example, a fly-eye lens, uniformly illuminates the mask (not shown) efficiently.

The condensing lens 250 is, for example, a condenser lens, and condenses as many beams from the optical integrator 240 as possible, superimposes them onto the stop 270, and Koehler-illuminates the blade 270 via the beam splitting part 260.

The beam splitting part 260 has three plane parallel plates as shown in FIG. 1, and splits condensed light into transmitted light and reflected light. The splitting method preserves the polarization of a beam as discussed above. In the present embodiment, the transmitted light split by the beam splitting part 260 illuminates the stop 270. The reflected light split by the beam splitting part 260 enters the detector 262 for detecting the light intensity.

The imaging lens (not shown) forms an image on the mask from the light having passed through the stop 270. Any technique known in the art is applicable to the illumination optical system 210 in the exposure apparatus 200, and thus a detailed description will be omitted.

A desired pattern is created on the mask, and diffracted light from the mask passes through a projection optical system (not shown), and forms a pattern image onto the wafer. The wafer is an object to be exposed such as a wafer and a liquid crystal plate, onto which resist is applied.

The projection optical system (not shown) may use an optical system solely composed of a plurality of lens elements, an optical system comprised of a plurality of lens elements and at least one concave mirror, and an optical system comprised of a plurality of lens elements and at least one diffractive optical element such as a kinoform. An optical element fabricated from the sample with a transmittance of a preset value or higher, and measured by the inventive transmittance measurement apparatus is applicable to optical elements such as lenses for the projection optical system.

The control part (not shown) typically includes CPU, and a memory, which is connected to the detector 260. Regardless of its name, the CPU may covers an MPU or any other processor for controlling the operation of each section. The memory includes a ROM and RAM, and stores firmware operating the exposure apparatus, and data on an optimal exposure amount (or illuminance). In this embodiment, the control part feeds back the light intensity of the laser 220 so that the fluctuation of the light intensity detected by the detector 262 may fall within a permissible range.

The thus-structured exposure apparatus 200 exhibits the following operations: The exposure apparatus 200 uses the illumination apparatus 210 to illuminate the mask, and exposes a desired mask pattern onto the wafer via the projection optical apparatus (not shown). Simultaneously, the control part (not shown) of the exposure apparatus 200 feeds back the light intensity of the laser 220 based on the light intensity detected by the detector 262, i.e., the illuminance to illuminate the mask, so that the fluctuation of the light intensity may fall within a predetermined range.

As discussed, in the inventive beam splitting part 260, the light entering the splitting means and the split light have the same polarization. Therefore, the exposure apparatus 200 can accurately control the exposure light intensity regardless of a change in polarization characteristic in the illumination optical systems due to the polarized fluctuation of the laser 220. An optical element fabricated from a sample with the transmittance of a preset value or higher and measured by the transmittance measurement apparatus of the present invention is applicable to optical elements such as lenses for use with the illumination optical system so as to realize accurate (high resolution) exposure using an optical element that has reliable optical performance in the UV light, far UV light and vacuum UV light. The throughput will improve due to illumination with uniform light intensity and provide a precise pattern transfer to the resist, thus providing high-quality devices (such as semiconductor devices, LCD devices, photographing devices (such as CCDs, etc.), thin film magnetic heads, and the like).

Figure 9:
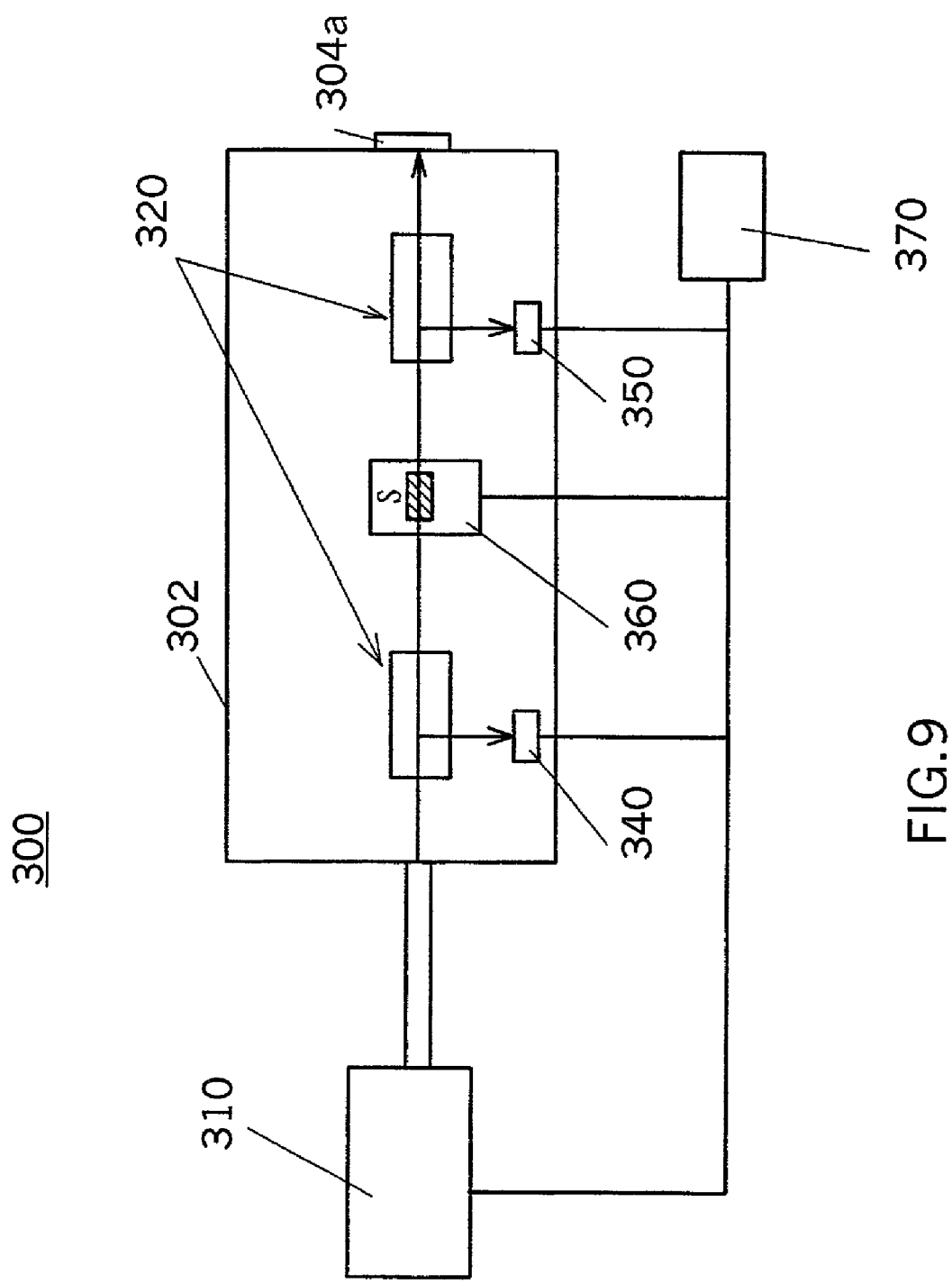
FIG. 9 is a block diagram showing a transmittance measurement apparatus of one aspect of the present invention.

A description will now be given of a transmittance measurement apparatus 300 including a beam splitting part 320 as one aspect of the present invention. FIG. 9 is a block diagram of a transmittance measurement apparatus 300.

Figure 10:
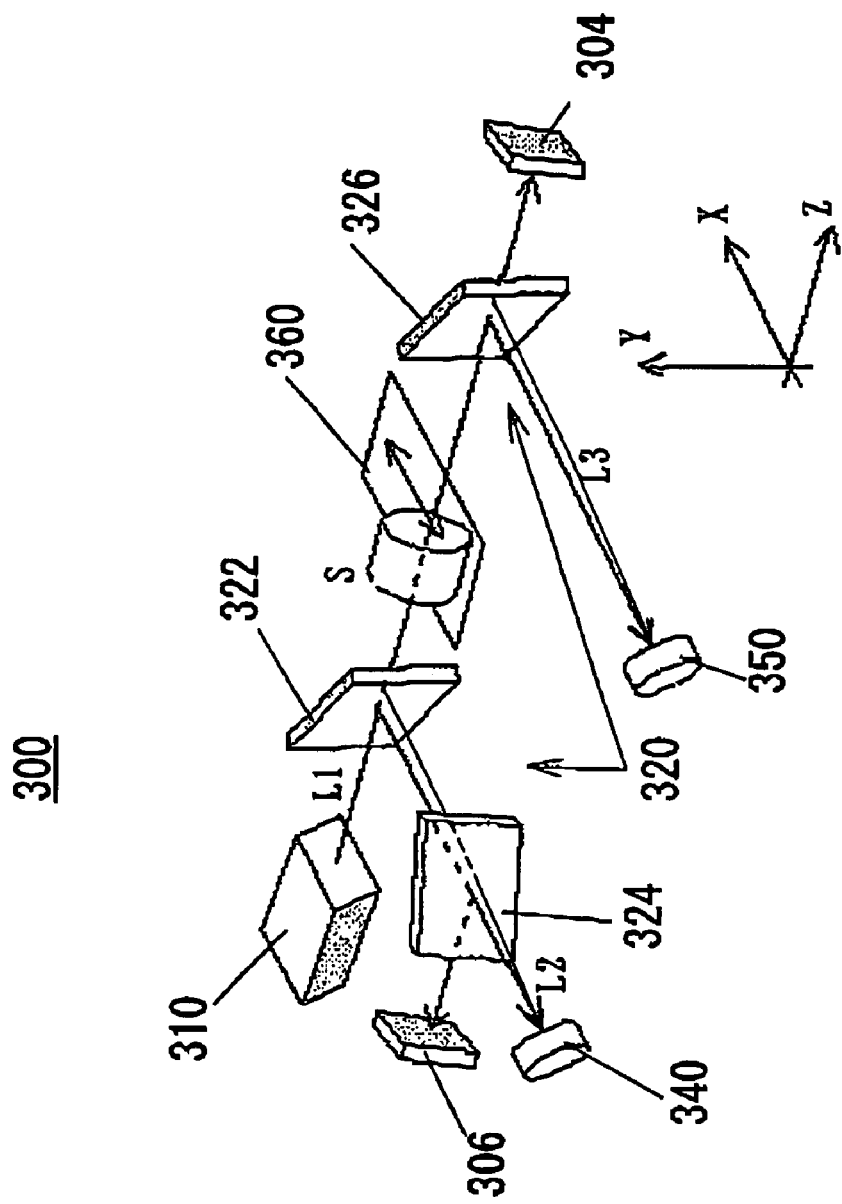
FIG. 10 is a schematic perspective view showing part of the transmittance measurement apparatus shown in FIG. 1.
Figure 11A:
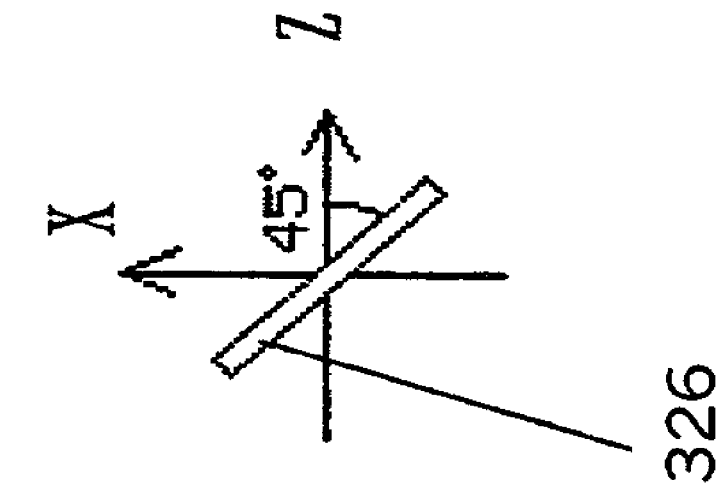
FIG. 11A is a side view showing a first plane parallel plate shown in FIG. 10 on a plane ZX.
Figure 11B:
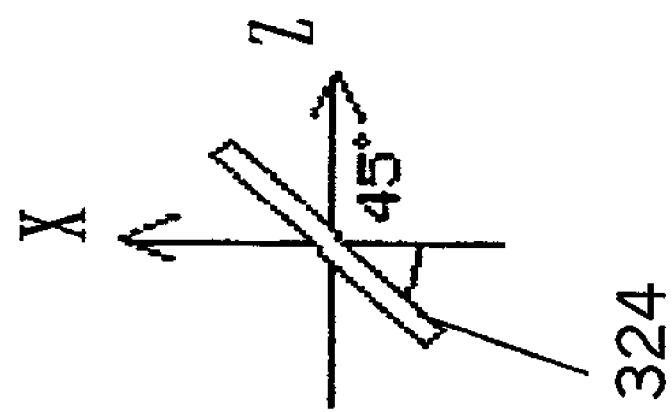
FIG. 11B is a side view showing a second plane parallel plate shown in FIG. 10 on a plane ZX.
Figure 11C:
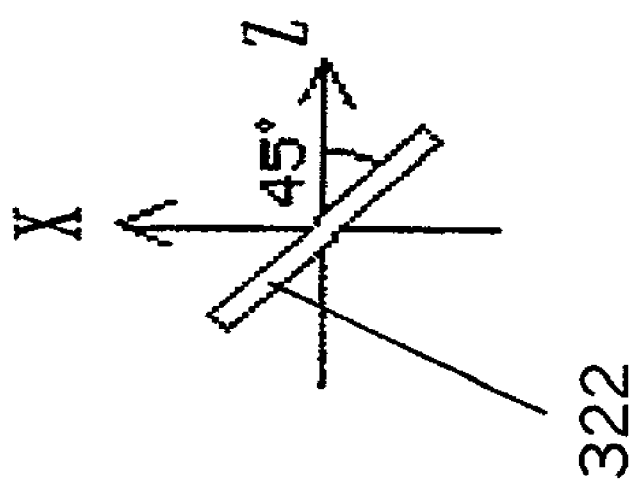
FIG. 11C is a side view showing a third plane parallel plate shown in FIG. 10 on a plane ZX.

Referring to FIGS. 9–11, a description will be given of the transmittance measurement apparatus 300 as one aspect of the present invention. Here, FIG. 10 is a schematic perspective view of part of the transmittance measurement apparatus 300. FIG. 10 assumes that a traveling direction of the beam L1 emitted from a light source 310 is a Z-axis, a direction vertical to the Z-axis in a plane of the light source 310 is an X-axis, and a normal direction to the plane of the light source 310 is a Y-axis. FIG. 11 is a view for explaining the beam splitting part 320. FIG. 11A is a side view showing a first plane parallel plate 322 on a plane ZX. FIG. 11B is a side view showing a second plane parallel plate 324 on a plane ZX. FIG. 11C is a side view showing a third plane parallel plate 326 on a plane ZX. The transmittance measurement apparatus 300 is a measuring apparatus that uses the light from the light source 310 to measure the transmittance of a sample S, and includes the light source 310, the beam splitting part 320, detectors 340 and 350, a stage 360, and a control part 370.

As shown in FIG. 9, the beam splitting part 320, detectors 340 and 350, and stage 360 are housed in a measurement chamber 302 that defines a different atmosphere from the outside (although the measurement chamber 302 is not shown in FIG. 10). The light source 310, detectors 340 and 350, and stage 360 are electrically connected to the control part 370 located outside of the measurement chamber 302. The light source 310 is arranged such that a (tested) beam can be radiated to the sample on the stage 360 in the measurement chamber 302. The measurement chamber 302 not only defines the measurement space, but also creates an atmosphere different than outside of the measurement chamber 302 using, for example, nitrogen gas, so as to measure the transmittance of the sample S with accuracy. Nitrogen gas prevents a laser beam from generating ozone, and keeps oxygen from absorbing the laser beam, thus contributing to the improvement of accuracy in measuring the sample's transmittance. Of course, the gas that forms the atmosphere of the measurement chamber 302 is not limited to the nitrogen gas, and other inert gases are applicable. Using stainless steel, aluminum, etc. to build the measurement chamber 302 would prevent the measurement chamber from becoming a source of contamination for the measurement space.

The light source 310 emits a specific beam to the sample S, and is made up of, for example, a UV pulse laser, such as an excimer laser, etc. The transmittance measurement apparatus 300 of this embodiment may be suitable for measurement of the transmittance of the sample S using an UV pulse laser for the light source 310, but other kinds of light sources (e.g., a xenon lamp, and others) may be applied for the light source 310. The transmittance measurement apparatus 300 of this embodiment does not preclude transmittance measurement for the sample S in this structure.

The beam splitting part 320 splits the beam L1 from the light source 310 into a reference beam L2 and a tested beam L3 as well as introducing the reference beam L2 and tested beam L3 to the detectors 340 and 350. The beam splitting part 320 of this embodiment also serves to make a correction so that the reference beam L2 and the tested beam L3 entering the detectors 340 and 350 may have the same polarization.

As shown in FIG. 10, the beam splitting part 320 exemplarily includes three plane parallel plates (i.e., first, second and third plane parallel plate 322, 324, and 326), and the second and third plane parallel plates 324 and 326 are provided on the beam split by the first plane parallel plate 322 with a specific limitation described later. Of course, the arrangement of the three parallel plates is not limited to the configuration shown in FIG. 10 as far as the beams incident upon the detectors 340 and 350 are arranged such that their polarizations are equal.

Preferably, the three plane parallel plates (322 to 326) are made up of plane parallel plates having the same reflectance and transmittance, but they may be configured by optical elements such as beam splitters, and the like. In order to maintain high efficiency to the split beams and to deliver the beams to detectors with minimized loss, beam splitters themselves are also required to have high durability and high transmittance at the wavelength of the light source. When using high energy light sources, such as KrF, ArF and F2 excimer lasers with short wavelengths, the thickness of the beam splitters, whether they are cubes or parallel plates, must be minimized. Especially with pulsed lasers, the instantaneous energy can be very high and may give damages to the materials of beam splitters. For use with UV, DUV, VUV and high energy pulsed light sources, plane parallel plates are often preferred as the beam splitters. When using plane parallel plates, the polarization states of the back surface reflected beams are theoretically equal to those of corresponding beams and thus will not cause errors in the measurement of transmittance. With the long coherency of the light source 310, surface reflection beams and back reflection beams of the three plane parallel plates (322 to 326) may interfere with each other. The plane parallel plates 322 to 326 may have a slight wedge angle to avoid the interference. In case, the wedge angle should be so much as to generate several interference fringes caused by a beam overlap or as no beam overlap seen at the light receiving plane (not shown) of the detectors 340 and 350.

The first plane parallel plate 322 reflects and transmits the beam L1 emitted from the light source 310 to generate the reflected beam and the transmitted beam, thus splitting the beam L1 emitted from the light source 310. As shown in FIGS. 10 and 11A, the first plane parallel plate 322 is arranged such that its incident plane upon the beam L1 is parallel to the Y-axis and a normal direction of the incident plane forms 45° with the optical axis of such a beam. Understandably, the first plane parallel plate 322 is not limited to such a setting angle as far as it is so arranged that a beam emitted from the light source 310 is split into two.

The second plane parallel plate 324, which corrects the reflected beam split by the first plane parallel plate 322, generates the beam (reference beam) L2 having the same reflection and transmission properties (i.e., the same polarization) as the beam (tested beam) L3 entering the detector 350, as well as introducing the reference beam L2 to the detector 340. Specifically, the second plane plate 324 generates the beam L2 while transmitting the beam reflected by the first plane parallel plate 322 so that its transmission property may be the same as that of the beam L3.

As shown in FIGS. 10 and 11B, when the first plane parallel plate 322 is arranged to form 45° with the Z-axis, the second plane parallel plate 324 is arranged such that the incident plane of the reflected beam reflected by the first plane parallel plate 322 is parallel to the Y-axis and the normal direction of the incident plane forms 45° with the optical axis of such a reflected beam. The present invention is not limited only to this value as far as the second plane parallel plate 324 is arranged such that the beam L2 has the same reflection and transmission properties. Part of the beam reflected by the first plane parallel plate 322 will be reflected by the second plane parallel plate 324, but such a reflected beam will be absorbed by a damper 306 provided in the measurement chamber 302. This will prevent a reflection component of the beam L2 from becoming flare.

The third plane plate 326, which corrects the transmitted beam split by the first plane parallel plate 322, generates the beam (tested beam) L3 having the same reflection and transmission properties (i.e., the same polarization) as the beam (reference beam) L2 entering the detector 340, as well as introducing the tested beam L3 to the detector 350. Specifically, the third plane plate 326 serves to generate the beam L3 while reflecting the beam transmitted by the first plane parallel plate 322 so that its reflection property may be the same as that of the beam L2.

As shown in FIGS. 10 and 11C, when the first plane parallel plate 322 is arranged such that it forms 45° with the Z-axis, the third plane parallel plate 326 is arranged such that the incident plane of the transmitted beam transmitted by the first plane parallel plate 322 is parallel to the Y-axis and the normal direction of the incident plane forms 45° with the optical axis of such a reflected beam. The present invention is not limited only to this value as far as the third plane parallel plate 324 is arranged such that the beam L3 has the same reflection and transmission properties as the beam L2. The third plane parallel plate 326 transmits part of the incident beam, but such a transmitted beam will be absorbed by a damper 304. This will prevent a transmitted component of the beam L3 from becoming flare.

Figure 12:
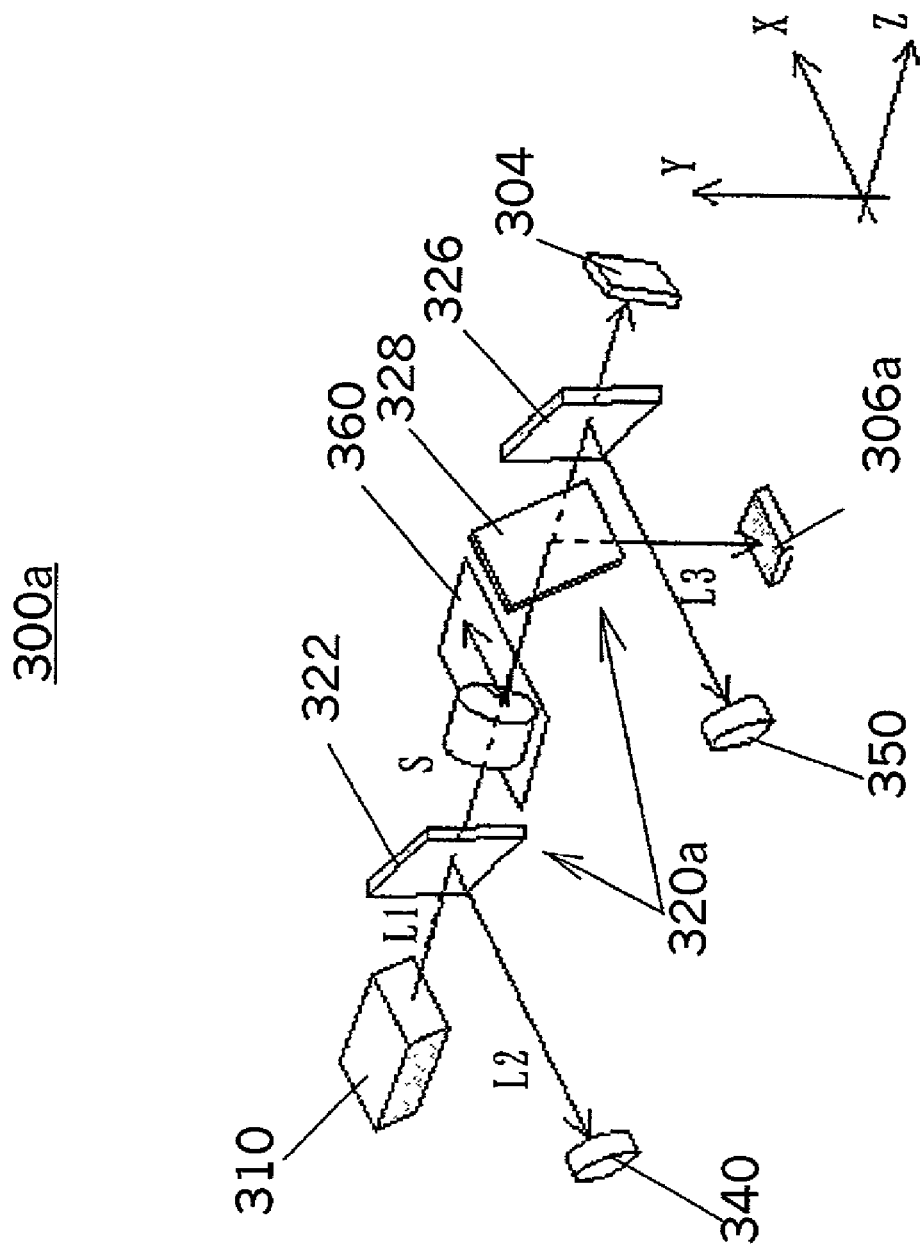
FIG. 12 is a view corresponding to FIG. 10, showing part of a transmittance measurement apparatus that includes a variation of the beam splitting part shown in FIG. 9.
Figure 13:
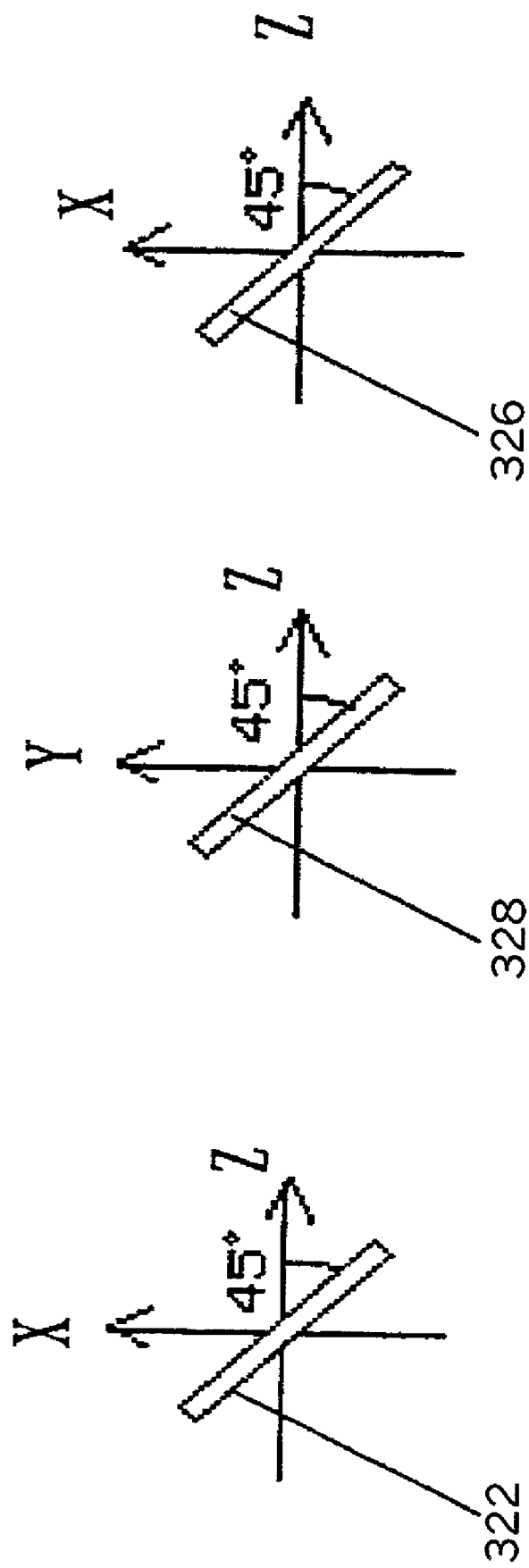
FIG. 13A is a side view showing a first plane parallel plate shown in FIG. 12 on a plane ZX.
FIG. 13B is a side view showing a second plane parallel plate shown in FIG. 12 on a plane ZY.
FIG. 13C is a side view showing a third plane parallel plate shown in FIG. 12 on a plane ZX.

With reference to FIGS. 12 and 13, the beam splitting part 320 may be replaced with a beam splitting part 320a. Here, FIG. 12 is a view corresponding to FIG. 10, showing a transmittance measurement apparatus 300a that includes a beam splitting part 320a, which is a variation of the beam splitting part 320 shown in FIG. 9. FIG. 13 is a view for explaining the beam splitting part 320a shown in FIG. 12. FIG. 13A is a side view showing a first plane parallel plate 322 on a ZX plane. FIG. 13B is a side view showing a second plane parallel plate 328 on a plane ZY. FIG. 13C is a side view showing a third plane parallel plate 326 on a plane ZX. Similar to the beam splitting part 320, the beam splitting part 320a splits the beam L1 from the light source 310 into the reference beam L2 and the tested beam L3, as well as introducing these reference beam L2 and tested beam L3 to the detectors 340 and 350. The beam splitting part 320a serves to make a correction so that the reference beam L2 and the tested beam L3 entering the detectors 340 and 350 respectively have the same polarization.

As shown in FIG. 12, the beam splitting part 320a exemplarily includes three plane parallel plates (a first plane parallel plate 322, a second plane parallel plate 328, and a third plane parallel plate 326), and the second and third plane parallel plates 328 and 326 are provided on the beam transmitted by the first plane parallel plate 322 with a specific limitation described later. The beam splitting part 320a is different from the beam splitting part 320 in that the beam splitting part 320 arranges the second plane parallel plate 324 in the beam reflected by the first plane parallel plate 322, while the beam splitting part 320a arranges the second plane parallel plate 328 in the beam transmitted by the first plane parallel plate 322. The rest of the structure is the same.

The second plane parallel plate 328, which corrects the transmitted beam split by the first plane parallel plate 322, contributes to the generation of the beam (tested beam) L3 having the same polarization as the beam (reference beam) L2 entering the detector 340. Specifically, the second plane parallel plate 328 transmits a linear polarization component, having transmitted the first plane parallel plate 322, as a linear polarization component that is orthogonal to this linear polarization component, thus contributing to the generation of the beam L3.

The second plane parallel plate 328, despite of such a structure, will thus have an effect similar to the second plane parallel plate 324 described above.

As shown in FIGS. 12 and 13B, when the first plane parallel plate 322 is arranged to form 45° with the Z-axis, the second plane parallel plate 328 is arranged such that the incident plane of the transmitted beam transmitted by the first plane parallel plate 322 is parallel to the X-axis and the normal direction of the incident plane forms 45° with the optical axis of this transmitted beam. Of course, the present invention is not limited only to this value as far as the second plane parallel plate 328 is arranged such that the beam L3 has the same polarization as that of the beam L3. Part of the beam transmitted by the first plane parallel plate 322 will be reflected by the second plane parallel plate 328, but such a reflected beam will be absorbed by a damper 306a provided in the measurement chamber 302. This will prevent a reflection component of the beam L2 from becoming flare.

The third plane plate 326, which corrects the beam transmitted by the second plane parallel plate 328, generates the beam (tested beam) L3 having the same polarization as the beam (reference beam) L2 entering the detector 340, as well as introducing the tested beam L3 to the detector 350. Specifically, the third plane plate 326 serves to generate the beam L3 while reflecting the beam reflected by the first plane parallel plate 322 so that the reflected polarization characteristic of the incident beam may be the same as that of the beam reflected by the first plane parallel plate 322. The way of arranging the third plane parallel plate 326 is the same as that of the above beam splitting part 320, and thus a description will be omitted.

Figure 14:
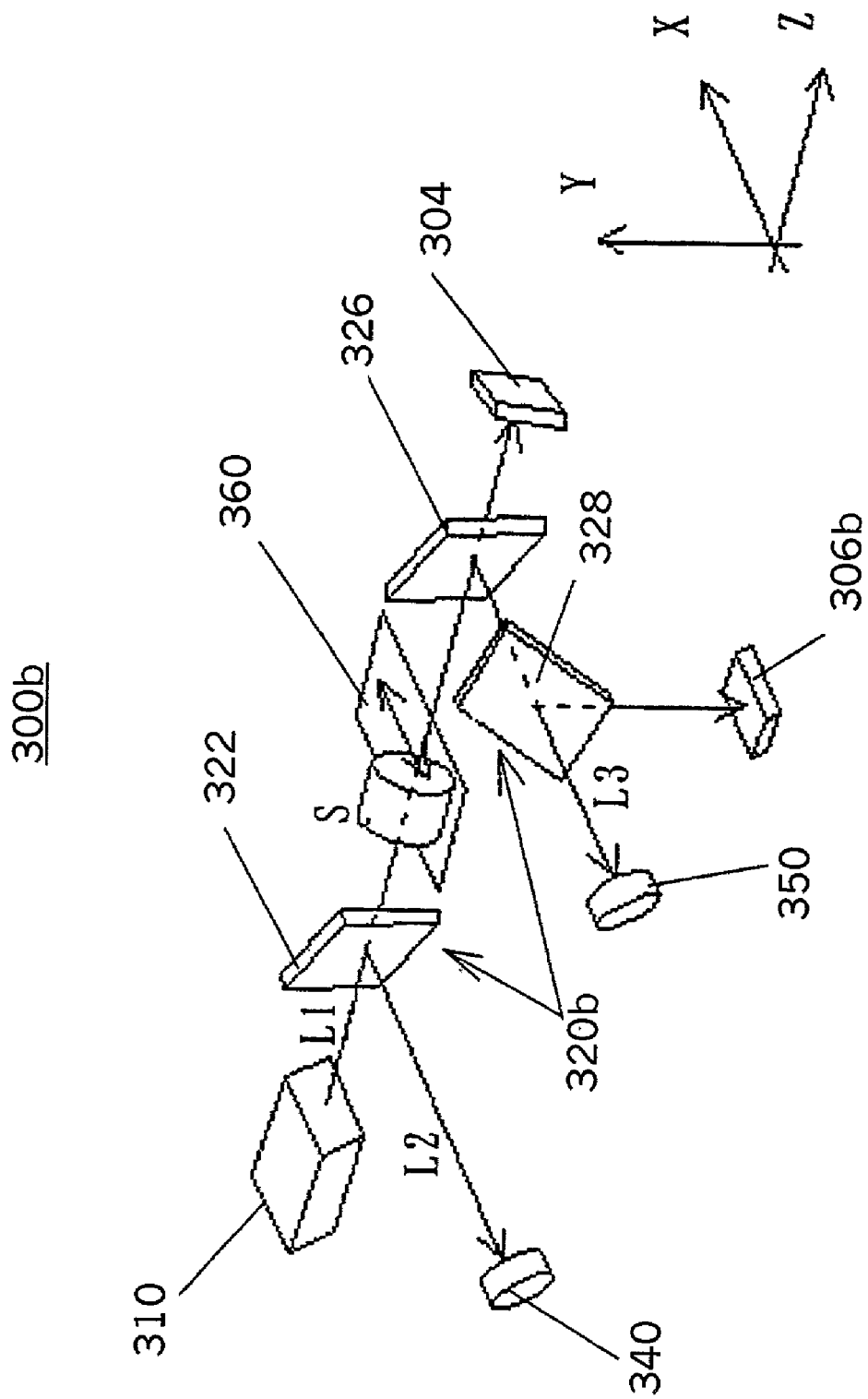
FIG. 14 is a view corresponding to FIG. 10, showing part of a transmittance measurement apparatus including a variation of the beam splitting part shown in FIG. 12.
Figure 15:
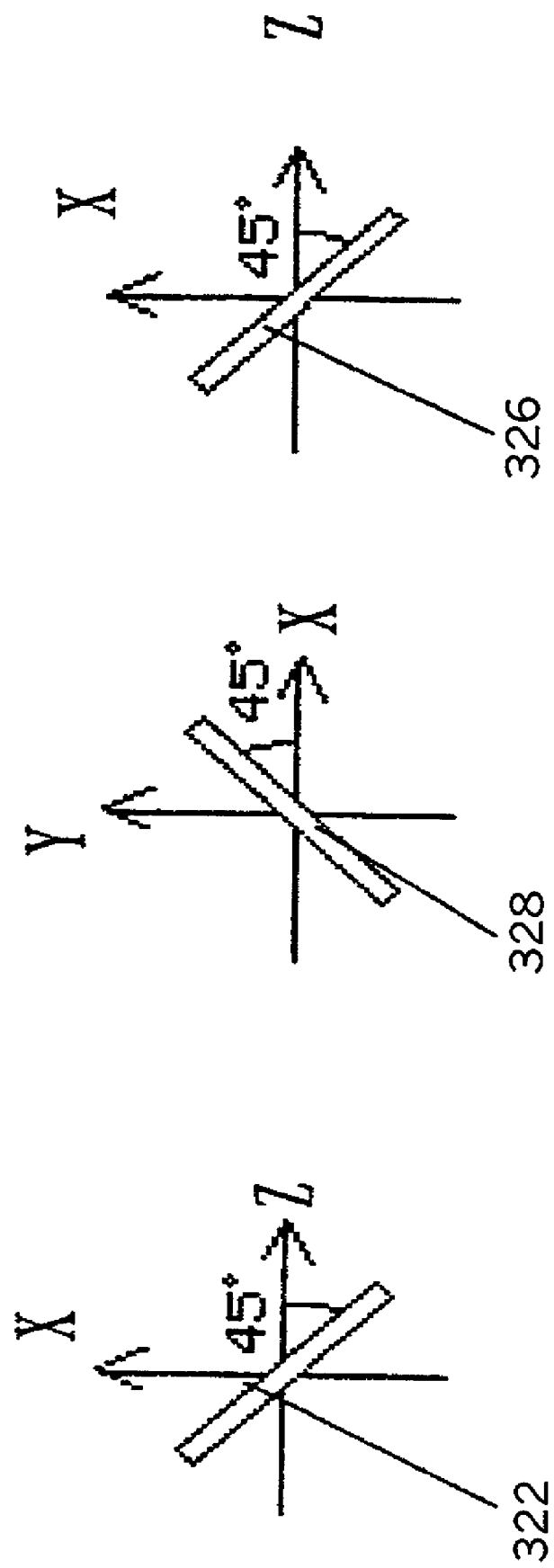
FIG. 15A is a side view showing the first plane parallel plate shown in FIG. 14 on a plane ZX.
FIG. 15B is a side view showing a second plane parallel plate shown in FIG. 14 on a plane XY.
FIG. 15C is a side view showing the third plane parallel plate shown in FIG. 14 on a plane ZX.

In the beam splitting part 320a shown in FIG. 12, the second plane parallel plate 328 is arranged on the optical axis of the beam transmitted by the first plane parallel plate 322 and before the third plane parallel plate 326. However, the structure may be as shown in FIGS. 14 and 15, if the beam L3's polarization is the same as that of the beam L2. Here, FIG. 14 is a view corresponding to FIG. 10, showing a transmittance measurement apparatus 300b including a beam splitting part 320b that is of another shape of the beam splitting part 320a shown in FIG. 12. FIG. 15 is a view for explaining the beam splitting part 320b shown in FIG. 14. FIG. 15A is a side view showing the first plane parallel plate 322 on a ZX plane. FIG. 15B is a side view showing a second plane parallel plate 328 on a plane XY. FIG. 15C is a side view showing the third plane parallel plate 326 on a plane ZX.

As shown in FIG. 14, the second plane plate 328 is provided on the optical axis of a reflected beam of the third plane parallel plate 326. As shown in FIGS. 14 and 15B, when the first plane parallel plate 322 is arranged to form 45° with the Z-axis, the second plane parallel plate 328 is arranged such that the incident plane of the reflected beam reflected by the third plane parallel plate 326 is parallel to the Z-axis and the normal direction of the incident plane forms 45° with the beam of such a reflected beam. Understandably, this structure will exhibit an operation similar to that of the above second plane parallel plate 328.

Figure 16:
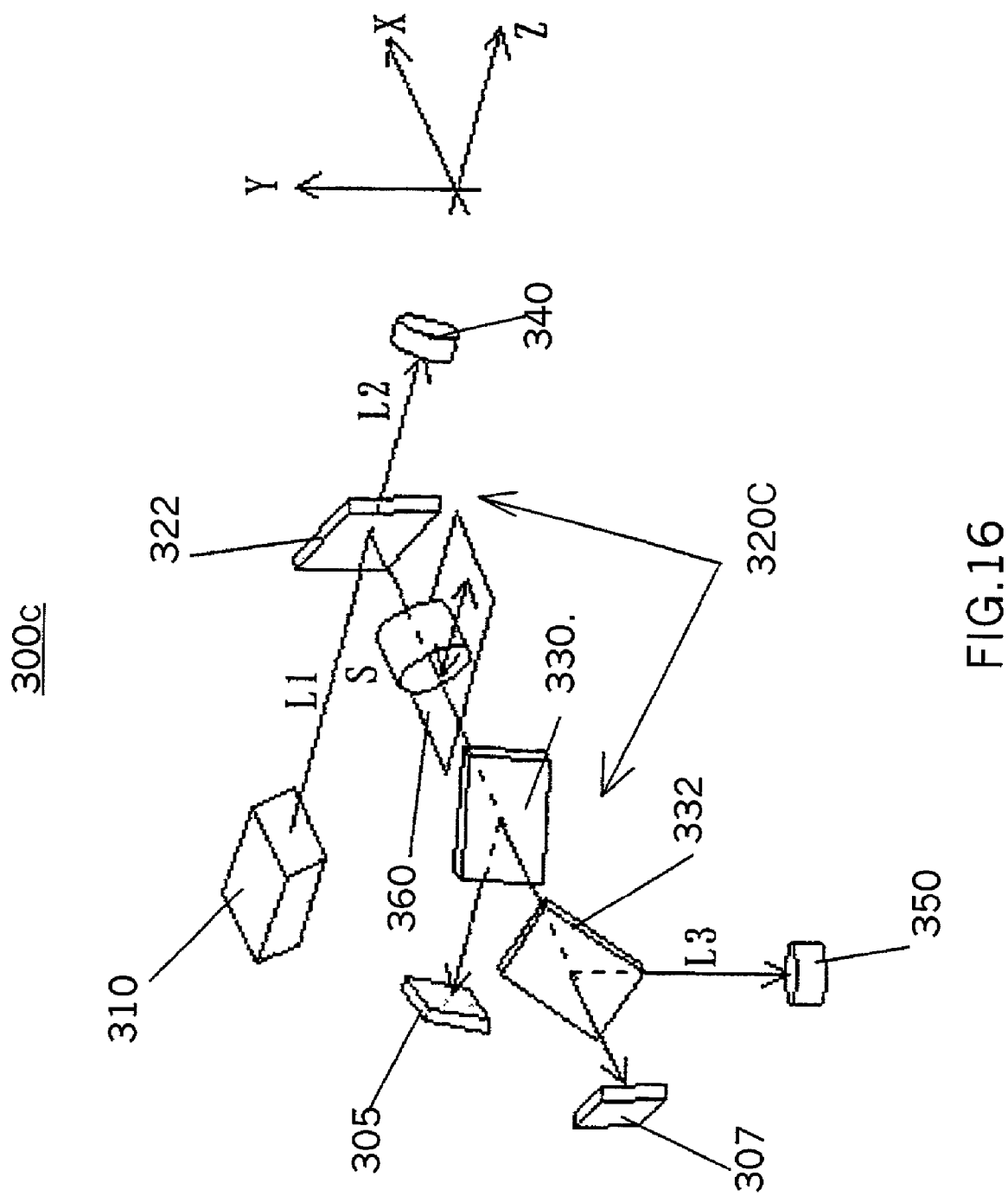
FIG. 16 is a view corresponding to FIG. 10, showing part of a transmittance measurement apparatus that includes a variation of the beam splitting part shown in FIG. 9.
Figure 17:
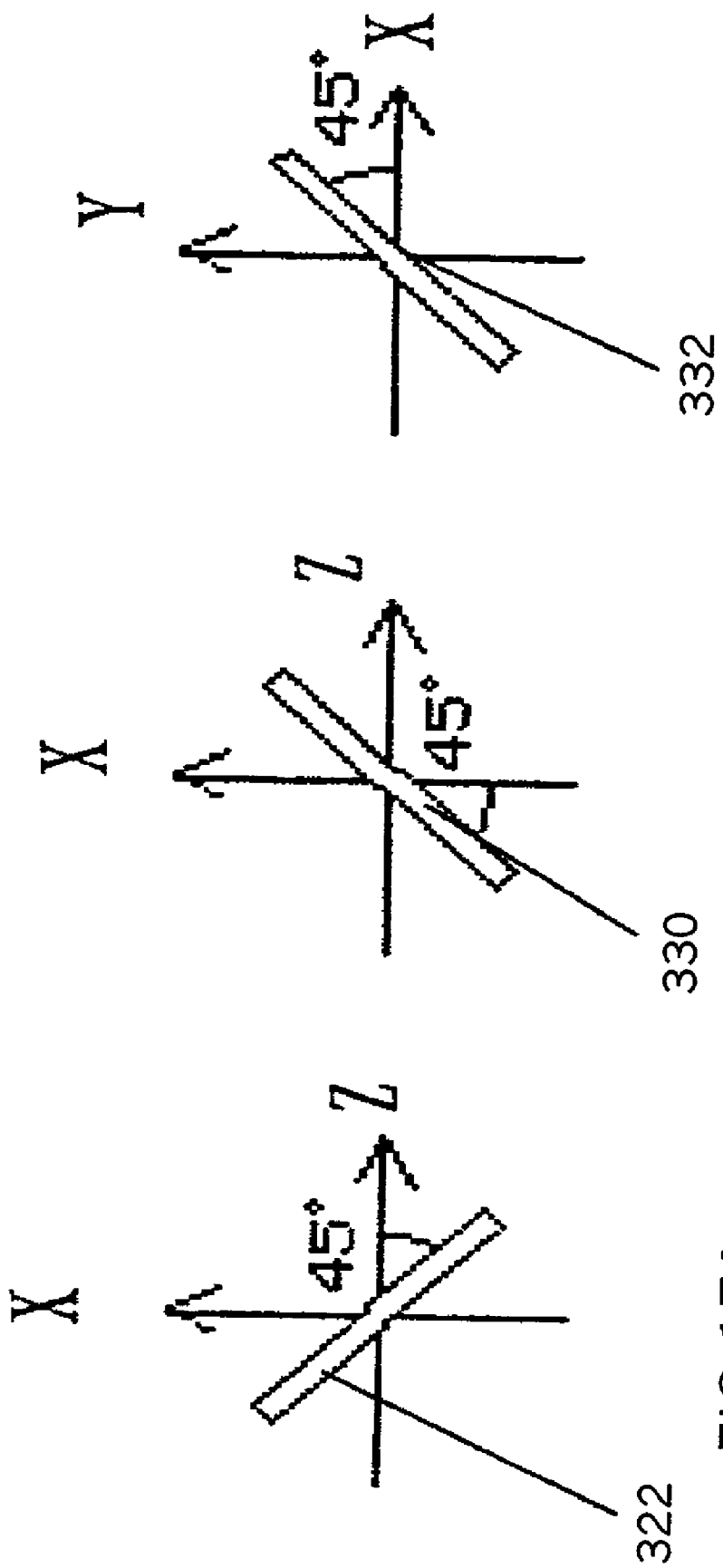
FIG. 17A is a side view showing a first plane parallel plate shown in FIG. 16 on a plane ZX.
FIG. 17B is a side view showing a second plane parallel plate shown in FIG. 16 on a plane ZX.
FIG. 17C is a side view showing a third plane parallel plate shown in FIG. 16 on a plane XY.

Referring to FIGS. 16 and 17, the beam splitting part 320 may be replaced by a beam splitting part 320c. Here, FIG. 16 is a view corresponding to FIG. 10, showing a transmittance measurement apparatus 300c that includes a beam splitting part 320c as a variation of the beam splitting part 320 shown in FIG. 9. FIG. 17 is a view for explaining the beam splitting part 320c shown in FIG. 16. FIG. 17A is a side view showing a first plane parallel plate 322 on a ZX plane. FIG. 17B is a side view showing a second plane parallel plate 330 on a plane ZX. FIG. 17C is a side view showing a third plane parallel plate 326 on a plane XY. Similar to the beam splitting part 320, the beam splitting part 320c splits the beam L1 emitted from the light source 310 into the reference beam L2 and the tested beam L3, as well as introducing these reference beam L2 and tested beam L3 to the detectors 340 and 350. Similar to the beam splitting part 320, the beam splitting part 320b also serves to make a correction so that the reference beam L2 and the tested beam L3 entering the detectors 340 and 350 respectively may have the same polarization.

As shown in FIG. 12, the beam splitting part 320c exemplarily includes three plane parallel plates (the first plane parallel plate 322, the second plane parallel plate 330, and the third plane parallel plate 332), and the second and third plane parallel plates 330 and 332 are provided on the beam reflected by the first plane parallel plate 322 with a specific limitation described later. The beam splitting part 320c is different from the beam splitting part 320 in that the beam splitting part 320 uses the beam transmitted by the first plane parallel plate 322 as the tested beam, while the beam splitting part 320c uses the beam reflected by the first plane parallel plate 322 as the tested beam.

The third plane parallel plate 332, which corrects the beam (reflected beam) split by the first plane parallel plate 322, contributes to the generation of the beam (tested beam) L3 having the same polarization as that of the beam (reference beam) L2 entering the detector 340. Specifically, the third plane parallel plate 332, which reflects the linear polarization component, reflected on the first plane parallel plate 322, as a linear polarization component that is orthogonal to this linear polarization component, contributes to the generation of the beam L3.

As shown in FIGS. 16 and 17B, when the first plane parallel plate 322 is arranged to form 45° with the Z-axis, the second plane parallel plate 330 is arranged such that the incident plane of the reflected beam reflected by the first plane parallel plate 322 is parallel to the Y-axis and the normal direction of the incident plane forms 45° with the optical axis of this reflected beam. Of course, the present invention is not limited only to this value as far as the second plane parallel plate 330 is arranged such that the beam L3 has the same polarization as that of the beam L2. Part of the beam will be reflected by the second plane parallel plate 330, but such a reflected beam will be absorbed by a damper 305 provided in the measurement chamber 302. This will prevent such a reflected beam from becoming flare.

The second plane plate 330, which corrects the beam (reference beam) split by the first plane parallel plate 322, generates the beam (tested beam) L2 having the same polarization as the beam (reference beam) L2 entering the detector 340, as well as introducing the tested beam L3 to the detector 350. Specifically, the second plane plate 330 serves to generate the beam L3 while transmitting the beam reflected by the first plane parallel plate 322 so that the transmitted polarization characteristic of the incident beam may be the same as that of the beam transmitted by the first plane parallel plate 322.

As shown in FIGS. 16 and 17C, when the first plane parallel plate is arranged to form 45° with the Z-axis, the third plane parallel plate 332 is arranged such that the incident plane of the reflected beam reflected by the first plane parallel plate 322 is parallel to the Z-axis and the normal direction of the incident plane forms 45° with the optical axis of this reflected beam. Of course, the present invention is not limited only to this value as far as the third plane parallel plate 332 is arranged such that the beam L3 has the same polarization as the beam L2. The third plane parallel plate 332 transmits a part of the incident beam, but such a transmitted beam will be absorbed by a damper 307. This will prevent a transmitted component of the beam L3 from becoming flare.

In the beam splitting part 320c shown in FIG. 16, the second plane parallel plate 330 is arranged on the optical axis of the beam transmitted by the first plane parallel plate 322 and before the third plane parallel plate 332. However, the structure may be as shown in FIGS. 18 and 19, if the beam L3's polarization is the same as that of the beam L2.

Figure 18:
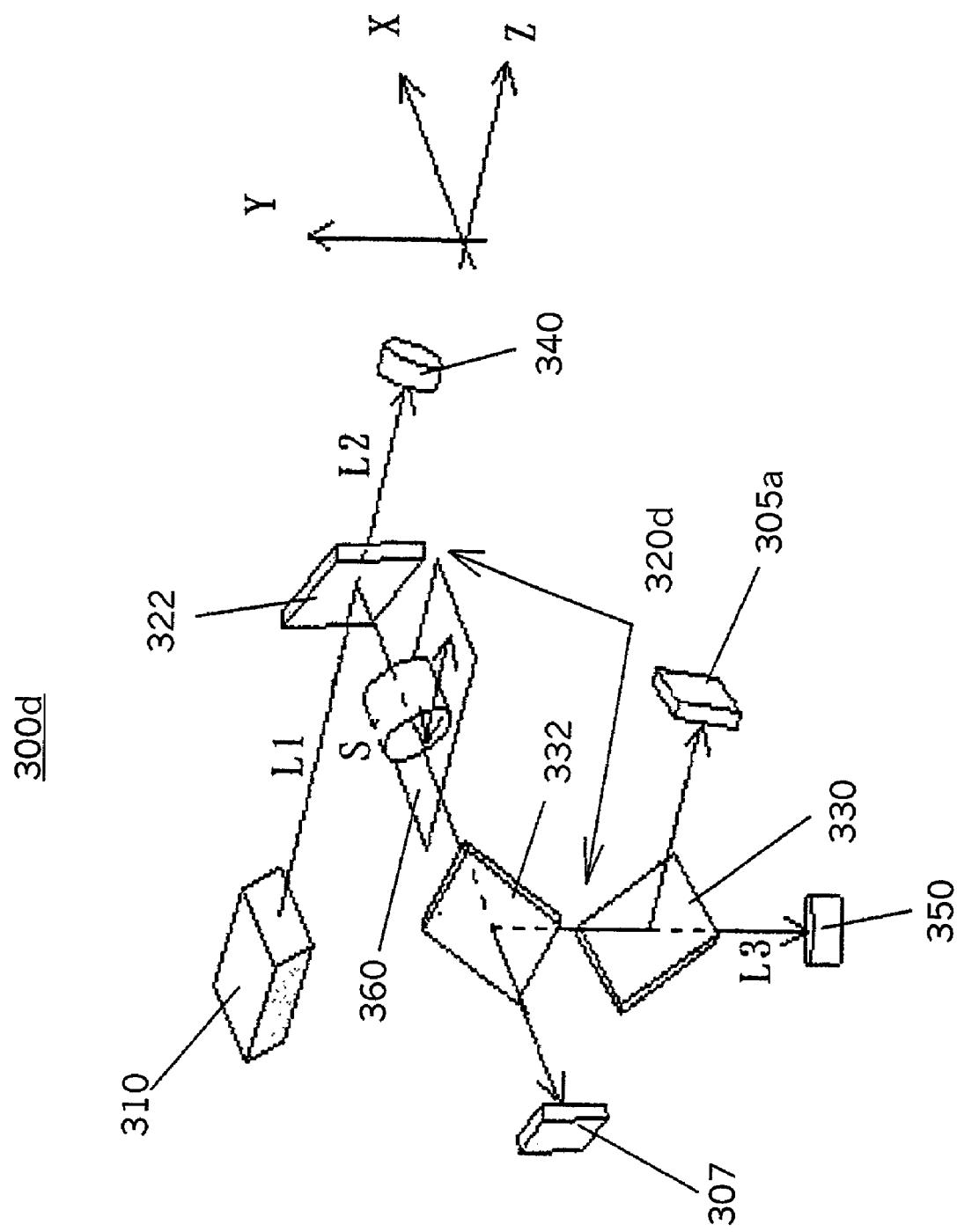
FIG. 18 is a view corresponding to FIG. 10, showing part of a transmittance measurement apparatus including a variation of the beam splitting part shown in FIG. 16.
Figure 19:
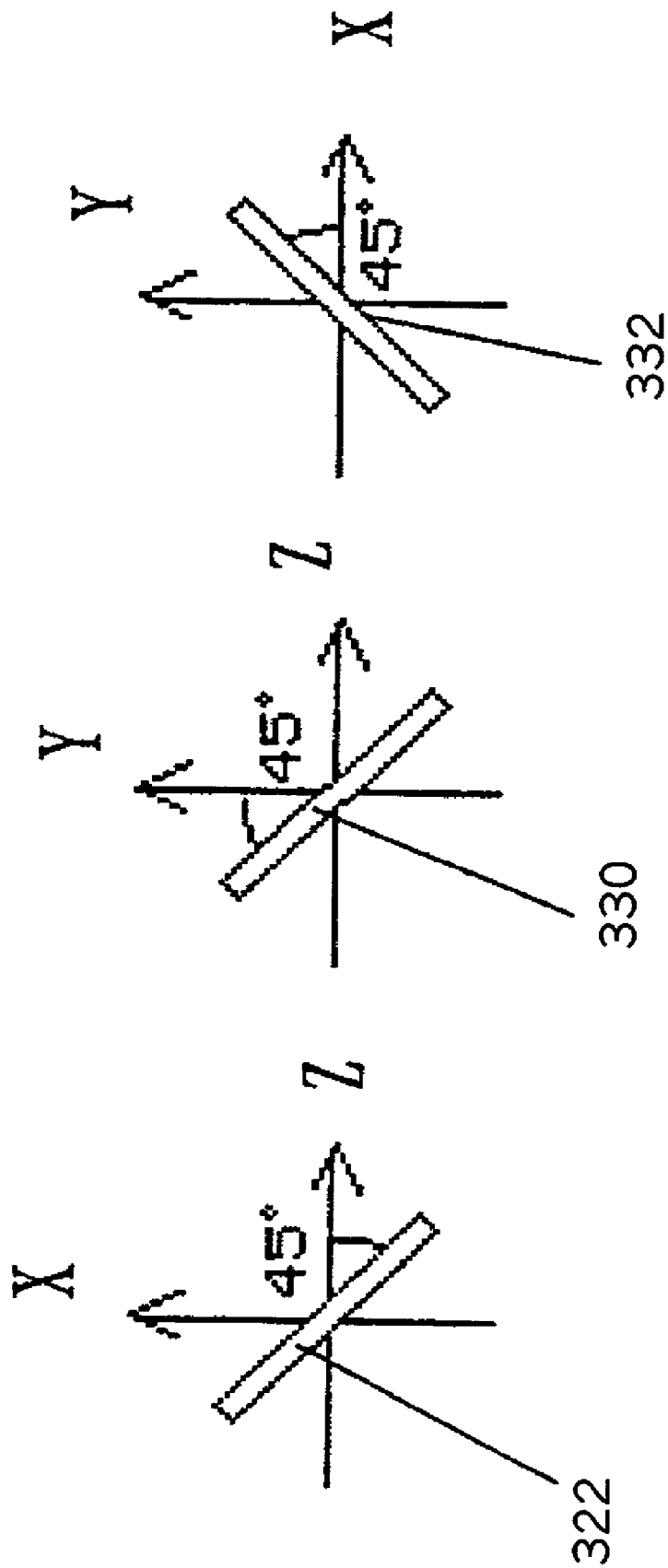
FIG. 19A is a side view showing the first plane parallel plate shown in FIG. 18 on a plane ZX.
FIG. 19B is a side view showing the second plane parallel plate shown in FIG. 18 on a plane ZY.
FIG. 19C is a side view showing the third plane parallel plate shown in FIG. 18 on a plane XY.

Here, FIG. 18 is a view, corresponding to FIG. 10, showing a transmittance measurement apparatus 300d including a beam splitting part 320d as a variation of the beam splitting part 320c shown in FIG. 16. FIG. 19 is a view for explaining the beam splitting part 320d shown in FIG. 18. FIG. 19A is a side view showing the first plane parallel plate 322 on a plane ZX. FIG. 19B is a side view showing the second plane parallel plate 330 on a plane ZY. FIG. 19C is a side view showing the third plane parallel plate 330 on a plane XY.

As shown in FIG. 18, the second plane plate 330 is provided on the optical axis of the reflected beam of the third plane parallel plate 332. As shown in FIGS. 18 and 19B, when the first plane parallel plate 322 is arranged to form 45° with the Z-axis, the second plane parallel plate 330 is arranged such that the incident plane of the reflected beam reflected by the third plane parallel plate 332 is parallel to the X-axis and the normal direction of the incident plane forms 45° with the beam of this reflected beam. Understandably, this structure will exhibit an operation similar to that of the above second plane parallel plate 330.

The detectors 340 and 350 detect the light mounts of the beams (reference beam L2 and tested beam L3) entering the pertinent detectors, and communicate these light intensities to the control part 370 electrically. The detector 340 is arranged on the optical axis of the beam L2, and the detector 350 on the optical axis of the beam L3, being electrically connected to the control part described later. The detectors 340 and 350 typically include a light receiving element and processor. They may apply any technique known in the art, and a detailed description thereof will be omitted.

The stage 360 carries the sample S, and serves as a mechanism for removably inserting the sample S onto the transmitting beam. For example, referring to FIG. 10, the stage 360 is arranged such that the sample S is positioned on the transmitted beam split by the first plane parallel plate 322. However, the location of the stage 360 is not limited to this as far as the sample S is positioned on the beams ranging from the first plane parallel plate 322 to the detector 350. Any technique known in the art is applicable to the mechanism that removably inserts the sample S onto the stage 360, and a detailed description thereof will be omitted. The stage 360 may be structured, for example, to move up and down (or right and left) relative to the optical axis so that such a movement enables the sample on the axis to be inserted and removed. The stage 360 is electrically connected to the control part 370, so that the removable insertion may be realized by the control part.

The control part 370 has CPU and a memory, and controls the operation of each part of the transmittance measurement apparatus 300. In the present embodiment, based on detection results from the detectors 340 and 350, the control part 370 measures the transmittance of the sample S, while it controls the light source 310 and the stage 360. The control part 370 sends a result of a transmittance measurement to an output device not shown (or to an external device including the transmittance measurement apparatus 300).

A description will now be given of an operation of the transmittance measurement apparatus 300 of the present invention. First, from the light source 310, the beam L1 is emitted. Here, the light source 310 is, e.g., an UV pulse laser of excimer laser and the like. The beam L1 from the light source 310 is reflected and transmitted by the first plane parallel plate 322, being split into two beams.

Referring to FIG. 10, the reflected beam split by the first plane parallel plate 322 as a reference beam transmits the second plane parallel plate 324 arranged on the optical path of the reflected beam, and is received by the detector 340.

On the other hand, the transmitted beam split by the first plane parallel plate 322 as a tested beam transmits the sample S fixed on the stage 360. The transmitted beam is reflected on the third plane parallel plate 326 arranged on its optical path, thus being received by the detector 350. In the above structure, the beams L2 and L3 received by the detectors 340 and 350 are reflected and transmitted equal times on the plane parallel plates arranged on the optical path. The polarization characteristics are maintained equal when the beams L2 and L3 are reflected and transmitted each time on the plane parallel plate.

From the signal beams of the reference beam L2 and the tested beam L3 detected by the detectors 340 and 350, an intensity ratio R (=tested beam voltage mean value/ reference beam voltage mean value) is calculated. Assuming intensities of a horizontal component and a vertical component are $I_H$ and $I_V$, the light intensity of the light source 310 can be expressed as $I_H+I_V$. The light intensity of the reference beam L2 detected by the detector 340 is expressed by the following equation.

$$r_{pr}^2 t_p^2 r_p^2 I_H + t_{sr}^2 t_s^2 r_s^2 I_V \quad (8)$$

The light intensity of the tested beam L3 detected by the detector 350 is expressed by the following equation.

$$r_p^2 t_{pr}^2 t_p^2 I_H + r_s^2 t_{sr}^2 t_s^2 I_V \quad (9)$$

where r and t are a Fresnel reflection coefficient and transmission coefficient, subscripts p and s are a polarization component at the time of reflection and transmission, and a subscript r is a side of exit of each plane parallel plate.

Thus, based on an intensity I determined while the sample S is set up in the beam, and an intensity $I_o$ while the sample S is removed from the beam, the transmittance T of the sample S for an ultraviolet pulse laser beam is calculated as $T=I/I_o$. This transmittance is sent to the output device, and thus, a user will know the transmittance of the sample S.

Using the inventive transmittance measurement apparatus 300, the ratio R between the light intensity detected by the detector 340 and the light intensity detected by the detector 350 is constant (R=1) regardless of a change in the light intensity $I_H+I_V$ of the light source 310. Consequently, without influence by the fluctuation of the light source 310, the ratio between the light intensity of the reference beam L2 and the light intensity of the tested beams L3 may be measured with accuracy. Because R=1, for sensors and the like used as the detectors 340 and 350, light intensity detection can be conducted with the same light intensity range for the same kinds of sensors. The S/N ratio of the light intensity detection is high, providing accurate measurement.

In order to eliminate fluctuating transmittance of a plane parallel plate used for this apparatus 300 and causes of measurement errors due to laser absorption, and the like, by an atmosphere inside the measuring instrument, the stage may use a removably inserting mechanism that periodically inserts the sample S onto the beam. In other words, it is possible to cancel an offset when a laser beam is not irradiated to the sample S by monitoring changes in output ratios from the detectors 340 and 350 while periodically the sample is taken out of the beam.

Referring to FIG. 12, the beam L1 from the light source 310 is split by the first plane parallel plate 322 into two beams, i.e., transmitted and reflected beams. The reflected beam split by the first plane parallel plate 322 as a reference beam is received by the detector 340, while the transmitted beam split is received by the first parallel plate 322 as a tested beam transmits the sample S fixed to the stage 360. This transmitted beam transmits the second plane parallel plate 328 arranged on the optical path, further reflects on the third plane parallel plate 326, and is received by the detector 350. In the structure shown in FIG. 12, the beams L2 and L3 received by the detectors 340 and 350 have equal reflected polarization characteristics on the first plane parallel plate 322 and the third plane parallel plate 326, and the transmitted polarization characteristic of the first plane parallel plate 322 and the transmitted polarization characteristic of the second plane parallel plate 322 are orthogonal to each other. The beams L2 and L3 has the same polarization.

In the structure shown in FIG. 12, the light intensity of the beam L2 detected by the detector 340 can be expressed by the following equation.

$$r_p^2 I_H + r_s^2 I_V \quad (10)$$

The light intensity of the beam L3 detected by the detector 350 is expressed by the following equation.

$$t_{pr}^2 r_p^2 t_{sr}^2 r_s^2 r_p^2 I_H + t_{sr}^2 r_s^2 t_{pr}^2 r_p^2 r_s^2 I_V \quad (11)$$

Therefore, the ratio R of the light intensities detected by the detectors 340 and 350 is given in the following fixed equation regardless of a change in light intensity ($I_H+I_V$) of the light source 310.

$$R = t_{pr}^2 r_p^2 t_{sr}^2 r_s^2 \quad (12)$$

Thus, it is possible to accurately measure the ratio of the light intensity of the reference beam L2 and the light intensity of the tested beam L3 without influence by the polarized fluctuation of the light source 310. The transmittance measurement apparatus 300a (or the transmittance measurement apparatus 300b) can accurately measure a transmittance of an optical member, and the like. By using the transmitted beam split by the first plane parallel plate 322 as a tested beam in the transmittance measurement apparatus 300a (or the transmittance measurement apparatus 300b), it is possible to measure a transmittance of a sample S when a high-power light intensity is applied to it.

Referring to FIG. 16, the beam L1 from the light source 310 is split by the first plane parallel plate 322 into two beams, i.e., transmitted and reflected beams. The transmitted beam split by the first plane parallel plate 322 as a reference beam is received by the detector 340, while the reflected beam split by the first parallel plate 322 as a tested beam transmits the sample S fixed to the stage 360. This transmitted beam transmits the second plane parallel plate 330 arranged on the optical path, reflects on the third plane parallel plate 332, and is received by the detector 350. Simultaneously, the beams L2 and L3 received by the detectors 340 and 350 have equal transmitted polarization characteristics on the first plane parallel plate 322 and the second plane parallel plate, and the reflected polarization characteristic of the first plane parallel plate 322 and the reflected polarization characteristic of the third plane parallel plate are orthogonal to each other. Thus, the beams L2 and L3 have the same polarization.

In the structure shown in FIG. 18, the light intensity of the beam L2 detected by the detector 340 can be expressed by the following equation.

$$t_{pr}^2 t_p^2 I_H + t_{sr}^2 t_s^2 I_V \qquad (13)$$

The light intensity of the beam L3 detected by the detector 350 can be expressed by the following equation.

$$t_{pr}^2 t_p^2 r_s^2 r_p^2 I_H + t_{sr}^2 t_s^2 r_p^2 r_s^2 I_V \qquad (14)$$

Therefore, the ratio R of the light intensity detected by the light intensity detecting mechanism and the light intensity detected by the light intensity detecting mechanism is given in the following equation.

$$R = r_p^2 r_s^2 \qquad (15)$$

The ratio of the light intensities of the reference beam and the tested beam can be measured with accuracy without influence by the polarized fluctuation of the light source 310. As a result, the transmittance measurement apparatus 300c (or the transmittance measurement apparatus 300d) can measure a transmittance of an optical member, and the like accurately. By using the transmitted beam split by the first plane parallel plate 322 as a tested beam in the transmittance measurement apparatus 300c (or the transmittance measurement apparatus 300d), it is possible to measure a transmittance of a sample S when a low-power light intensity is applied to it.

The transmittance measurement apparatuses 300–300d in FIGS. 9–19 are also applicable to the exposure apparatus 200 shown in FIG. 6. For example, an optical element fabricated from the sample having a transmittance of a preset value or higher, and measured by the inventive transmittance measurement apparatus is applicable to optical elements such as lenses for the illumination and projection optical systems.

Figure 20:
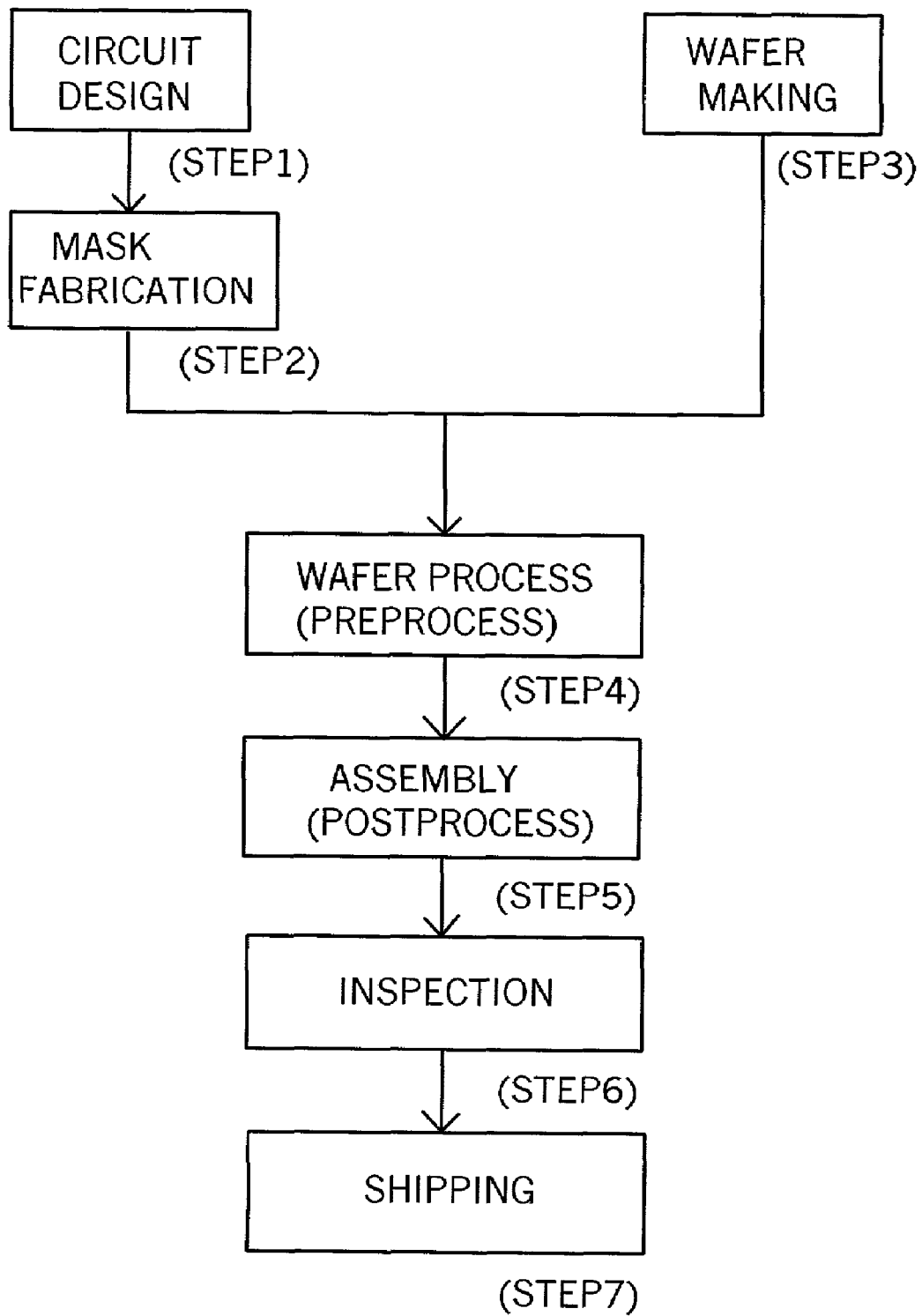
FIG. 20 is a flowchart for explaining a fabrication of devices (such as semiconductor chips like ICs and LSIs, LCDs, CCDs, and the like).
Figure 21:
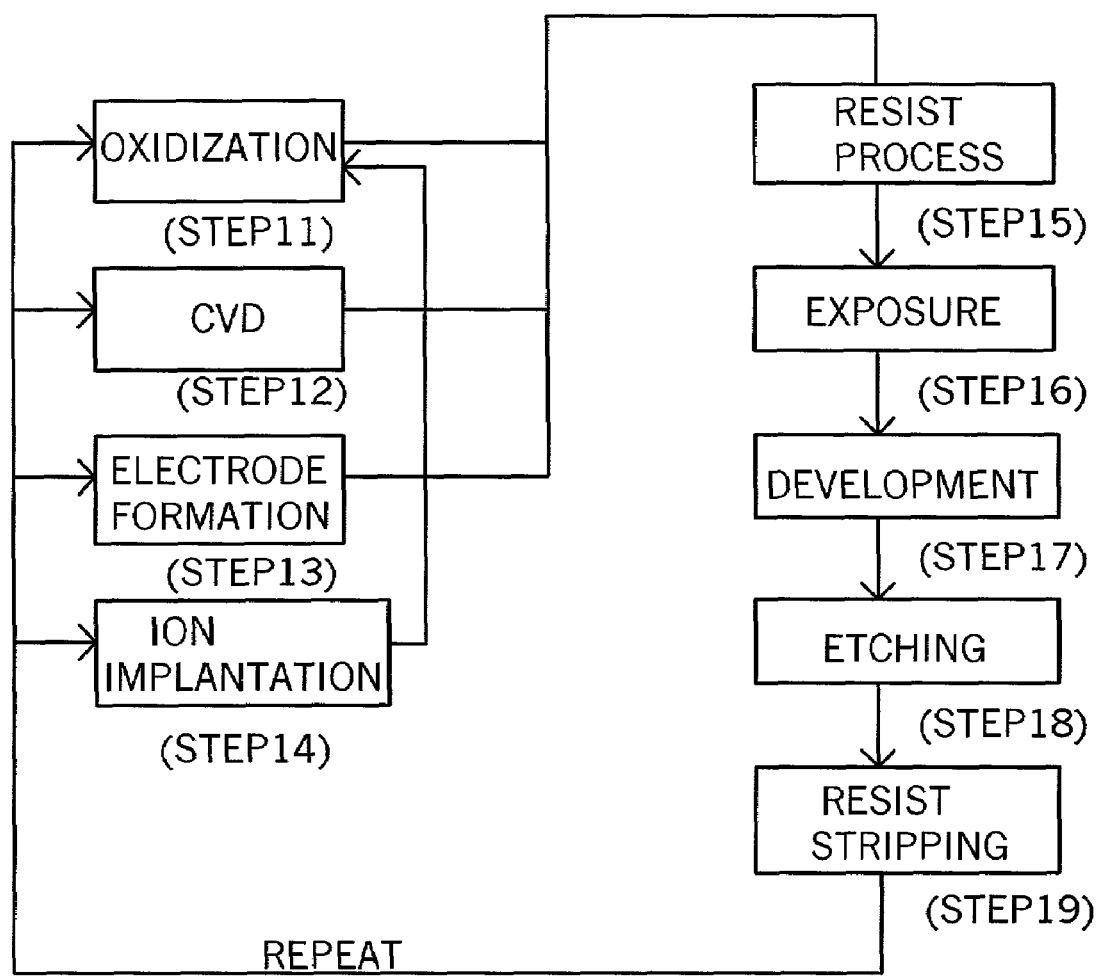
FIG. 21 is a flowchart for a wafer process of step 4 shown in FIG. 20.

Referring to FIGS. 20 and 21, a description will now be given of an embodiment of a device fabricating method using the above mentioned exposure apparatus 200. FIG. 20 is a flowchart for explaining how to fabricate devices (i.e., semiconductor chips such as IC and LSI, LCDs, CCDs). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through photolithography of the present invention using the mask and wafer. Step 5 (assembly), which is also referred to as a post-treatment, forms into a semiconductor chip the wafer formed in step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 21 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer. It is possible to fabricate more high-quality devices than ever by using the fabricating method of this embodiment. In this way, the device fabricating method using this exposure apparatus 200, and devices as a sample object are part of the present invention.

Further, the present invention is not limited to these preferred embodiments, and various variations and modifications may be made without departing from the spirit and scope of the present invention.

According to the beam splitting apparatus of the present invention, the light intensity of a UV pulse laser beam from an excimer laser, etc. as a light source can be split into light having the same polarization as the incident light without influence by the polarized fluctuation of the laser beam. A light intensity detecting apparatus including such a beam splitting apparatus can use the split light to detect the light intensity with accuracy. When this light intensity detecting apparatus is used to measure the transmittance, it may accurately detect the light intensity of the laser beam and transmittance of the optical element, thus providing a high-quality optical element. The light intensity detecting apparatus including a plurality of inventive beam splitting apparatuses can monitor light whose polarization is always equal to that of the incident light, thus accurately evaluating a photo-sensor's linearity for a light source (laser, etc.).

Use of the exposure apparatus including this beam splitting apparatus enables detection of an accurate exposure amount regardless of changes in polarization characteristics of illumination optical systems, thus performing accurate feedback control of the exposure amount. Therefore, use of such an exposure apparatus not only improves throughput, but also serves to provide high-quality devices.

What is claimed is:

1. A beam splitting apparatus comprising:
   a first transparent plate having a wedge, said first transparent plate inclining to an incident light, and splitting the incident light into a transmitted light and a reflected light, the reflected light including a light reflected on a front surface of said first transparent plate and a light reflected on a back surface of said first transparent plate;
   a second transparent plate inclining to the reflected light from said first transparent plate, said second transparent plate transmitting, toward a first detector, one part of the reflected light from said first transparent plate, and reflecting remaining part of the reflected light from said first transparent plate; and a third transparent plate having a wedge, said third transparent plate inclining to the transmitted light from said first transparent plate, said third transparent plate reflecting, toward a second detector, one part of the transmitted light from said first transparent plate that has the same polarization state as a transmitted light from said second transparent plate, and transmitting remaining part of the transmitted light from said first transparent plate, a reflected light from said third transparent plate including a light reflected on a front surface of said third transparent plate and a light reflected on a back surface of said third transparent plate, wherein the wedge of said first transparent plate is formed to generate several interference fringes on the first detector when the light reflected on the front surface of said first transparent plate interferes with the light reflected on the back surface of said first transparent plate, and wherein the wedge of said third transparent plate is formed to generate several interference fringed on the second detector when the light reflected on the front surface of said third transparent plate interferes with the light reflected on the back surface of said third transparent plate.

2. A beam splitting apparatus comprising:

a first transparent plate having a wedge, said first transparent plate inclining to an incident light, and splitting the incident light into a transmitted light and a reflected light, the reflected light including a light reflected on a front surface of said first transparent plate and a light reflected on a back surface of said first transparent plate;

a second transparent plate inclining to the reflected light from said first transparent plate, said second transparent plate for splitting the reflected light from said first transparent plate and for deflecting, toward a detector, one of light obtained by splitting the reflected light from said first transparent plate ;and a third transparent plate inclining to the transmitted light from said first transparent plate, said third transparent plate for reflecting one part of the transmitted light from said first transparent plate, and for transmitting remaining part of the transmitted light from said first transparent plate, one of a reflected and transmitted light from said third transparent plate having the same polarization state as a deflected light by said second transparent plate toward the detector, wherein the wedge of said first transparent plate is formed to generate several interference fringes on the detector when the light reflected on the front surface of said first transparent plate interferes with the light reflected on the back surface of said first transparent plate.

3. A beam splitting apparatus comprising:

a first transparent plate having a wedge, said first transparent plate inclining to an incident light, and splitting the incident light into a transmitted light and a reflected light, the reflected light including a light reflected on a front surface of said first transparent plate and a light reflected on a back surface of said first transparent plate;

a second transparent plate inclining to the reflected light from said first transparent plate, said second transparent plate for splitting the reflected light from said first transparent plate and for deflecting, toward a detector, one of split light by said second transparent plate; and a third transparent plate inclining to the transmitted light from said first transparent plate, said third transparent plate for splitting the transmitted light from said first transparent plate, one of split light by said third transparent plate having the same polarization state as a deflected light by said second transparent plate toward the detector, wherein the wedge of said first transparent plate is formed to generate several interference fringed on the detector when the light reflected on the front surface of said first transparent plate interferes with the light reflected on the back surface of said first transparent plate.

* * * * *

UNITED STATES PATENT AND TRADEMARK OFFICE
CERTIFICATE OF CORRECTION

PATENT NO. : 7,095,497 B2
APPLICATION NO. : 10/183311
DATED : August 22, 2006
INVENTOR(S) : Kishikawa et al.

It is certified that error appears in the above-identified patent and that said Letters Patent is hereby corrected as shown below:

On the cover page of the issued patent

In the Inventors (75), replace "Yasuhiro Kishikawa, Tochogi (JP)" with --Yasuhiko Kishikawa, Tochigi (JP)--

Column 12

Line 66, replace "101A" with --100A--;

Column 13

Line 33, replace "10A" with --100A--; and

Column 14

Line 22, replace "10B" with --100B--.

Signed and Sealed this

Twelfth Day of December, 2006

JON W. DUDAS
*Director of the United States Patent and Trademark Office*